United States Patent
Meehan et al.

(10) Patent No.: US 9,608,515 B2
(45) Date of Patent: Mar. 28, 2017

(54) RESONANCE DETECTION AND FILTERING CIRCUITRY

(71) Applicant: Analog Devices Global, Hamilton (BM)

(72) Inventors: Patrick J Meehan, Pallaskenry (IE); Thomas Conway, Limerick (IE); Adrian Paul Brokaw, Tucson, AZ (US); Donal G. O'Sullivan, Ardnacrusha (IE)

(73) Assignee: Analog Devices Global, Hamilton (BM)

( * ) Notice: Subject to any disclaimer, the term of this patent is extended or adjusted under 35 U.S.C. 154(b) by 282 days.

(21) Appl. No.: 14/631,429

(22) Filed: Feb. 25, 2015

(65) Prior Publication Data

US 2016/0248319 A1    Aug. 25, 2016

(51) Int. Cl.
    *H02M 1/44*     (2007.01)
    *H02M 3/158*    (2006.01)
    *H03H 7/01*     (2006.01)
    *H02M 1/15*     (2006.01)

(52) U.S. Cl.
    CPC ............... *H02M 1/44* (2013.01); *H02M 1/15* (2013.01); *H02M 3/158* (2013.01); *H03H 7/0153* (2013.01); *H03H 2007/013* (2013.01); *H03H 2210/036* (2013.01)

(58) Field of Classification Search
    CPC ................................ H02M 1/44; H02M 3/158
    See application file for complete search history.

(56) References Cited

U.S. PATENT DOCUMENTS

| | | | | |
|---|---|---|---|---|
| 4,916,380 | A * | 4/1990 | Burroughs | H02M 1/14 323/266 |
| 6,810,124 | B1 * | 10/2004 | White | H03H 21/0012 381/71.1 |
| 8,803,615 | B2 * | 8/2014 | Cabanillas | H03H 7/40 330/302 |
| 8,885,376 | B2 | 11/2014 | Meehan et al. | |
| 2015/0236395 | A1 * | 8/2015 | Analui | H03H 7/46 333/117 |
| 2016/0164528 | A1 * | 6/2016 | Morton | H03L 7/093 327/157 |

OTHER PUBLICATIONS

Limjoco, Aldrick S., "Measuring Output Ripple and Switching Transients in Switching Regulators", Analog Devices AN-1144 Application Note, (2013), 8 pgs.

* cited by examiner

*Primary Examiner* — Emily P Pham

(74) *Attorney, Agent, or Firm* — Schwegman Lundberg & Woessner, P.A.

(57) ABSTRACT

A circuit and method to filter a signal is provided. The circuit includes a notch filter circuit to receive an input signal and first and second tuning signals and to provide an output signal. The notch filter circuit has an input-output frequency response that includes a stopband region. The stopband region has a center frequency and has an attenuation level that is based at least on a tuning signal. The tunable filter circuit further includes a tuning circuit operable in at least two modes to generate the tuning signal. The at least two modes includes a tuning mode and a filtering mode. The tuning circuit generates the tuning signal such that the attenuation level of the stopband region is greater in the filtering mode than in the tuning mode.

20 Claims, 7 Drawing Sheets

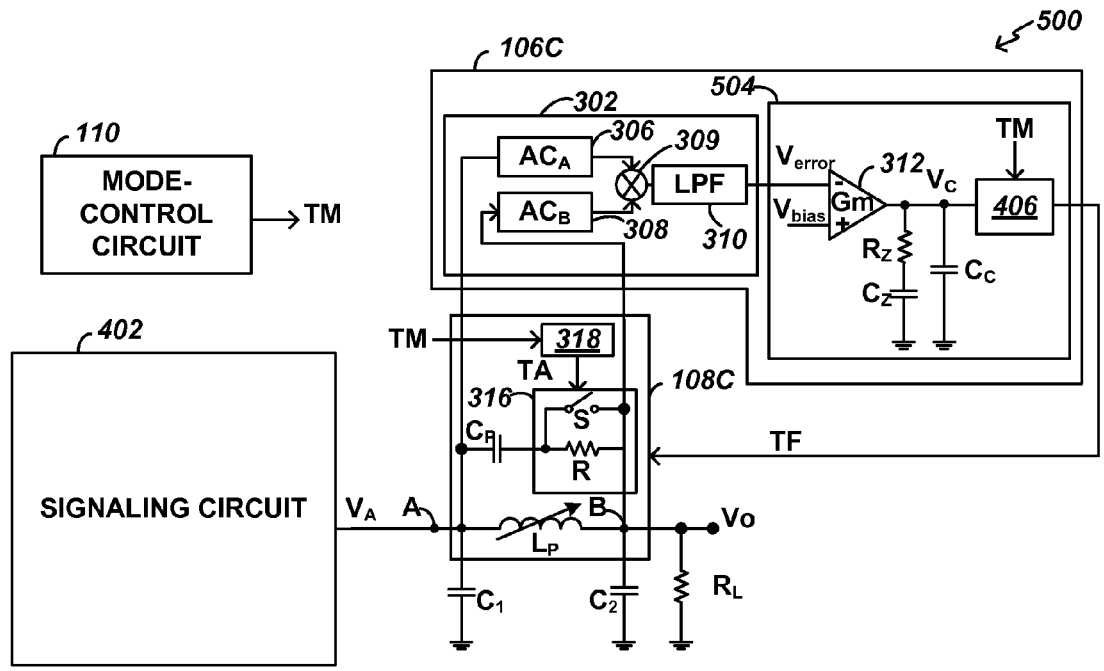
FIG. 5
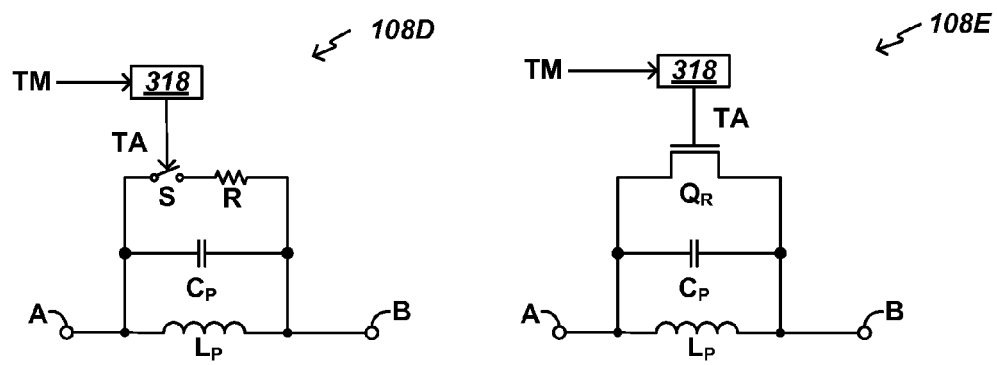
FIG. 6A  FIG. 6B

RESONANCE DETECTION AND FILTERING CIRCUITRY

FIELD

This application relates to the field of circuits and particularly to circuits for electronic filtering.

BACKGROUND

A signal chain is a series of electronic components in which one electronic component receives an input signal from a preceding electronic component of the series and provides an output signal to a subsequent electronic circuit in the series. Signal chains can be used in power or signal processing applications to provide power or process data. Power regulators can be used in signal chains to generate an output voltage at a desired level. For example, a switching regulator can include one or more switches that are turned on and off to control the charging of a storage inductor and a storage capacitor to produce a regulated output voltage. The switching causes the current in the regulator's storage inductor to increase and decrease at the switching frequency. This increasing and decreasing inductor current can be partially filtered by the regulator's storage capacitor.

OVERVIEW

The systems, methods, and devices of the inventive subject matter each have several aspects, no single one of which is solely responsible for its desirable attributes. Without limiting the scope of the embodiments of the invention as expressed by the claims which follow, some features will now be discussed briefly. After considering this discussion, and particularly after reading the section titled "Detailed Description," one will understand how the features of the embodiments provide benefits that include improving filtering of signals.

In one embodiment, a circuit to attenuate a noise component is disclosed. The circuit includes a switching regulator circuitry to generate a power supply signal based on a first tuning signal corresponding to a clock signal. The power supply signal includes a signal component at a first frequency based on the first tuning signal. The circuit further includes a notch filter circuit to filter the power supply signal. The notch filter circuit has an input-output frequency response that includes a stopband region having a center frequency and an attenuation level. The attenuation level of the stopband region is based at least in part on a second tuning signal. The circuit further includes a tuning circuit operable in at least two modes to generate the first and second tuning signals. The at least two modes include a tuning mode and a filtering mode. The tuning circuit is operable in the at least two modes to generate the second tuning signal such that the attenuation level of the stopband region is greater in the filtering mode than in the tuning mode. The tuning circuit is operable in the tuning mode to generate the first tuning signal such that the tuning circuit adjusts the first tuning signal based at least on the unfiltered power supply signal and the filtered power supply signal to match the center frequency of the stopband region with the frequency of the signal component of the power supply signal.

In another example embodiment, tunable filter circuit is disclosed. The tunable filter circuit includes a notch filter circuit to receive an input signal and first and second tuning signals and to provide an output signal. The notch filter circuit has an input-output frequency response that includes a stopband region. The stopband region has a center frequency based at least on the first tuning signal and has an attenuation level based at least on the second tuning signal. The tunable filter circuit further includes a tuning circuit operable in at least two modes to generate the first and second tuning signals. The at least two modes includes a tuning mode and a filtering mode. The tuning circuit, in response to operating in the tuning mode, adjusts the first tuning signal based on the input signal and the output signal. The tuning circuit generates the second tuning signal such that the attenuation level of the stopband region is greater in the filtering mode than in the tuning mode.

In another example embodiment, a method to filter a signal is disclosed. The method includes receiving first and second tuning signals at tuning nodes of a notch filter. The notch filter has an input node and an output node providing an input-output frequency response that includes a stopband region. The stopband region has a center frequency based on the first tuning signal and has an attenuation level based on the second tuning signal. The method further includes filtering an input signal at the input node of the notch filter to generate a filtered signal at the output node of the notch filter. The method further includes generating the first and second tuning signals in one of at least two modes. The at least two modes includes a tuning mode and a filtering mode. The generating of the first and second tuning signals comprising, in response to switching from the filtering mode to the tuning mode, generating the second tuning signal to decrease the attenuation level of the stopband region and adjusting the first tuning signal based on the input signal and the filtered signal. The generating of the first and second tuning signals further comprising, in response to switching from the tuning mode to the filtering mode, generating the second tuning signal to increase the attenuation level of the stopband region.

BRIEF DESCRIPTION OF THE DRAWINGS

In the drawings, which are not necessarily drawn to scale, like numerals may describe similar components in different views. Like numerals having different letter suffixes may represent different instances of similar components. The drawings illustrate generally, by way of example, but not by way of limitation, various embodiments discussed in the present document.

FIG. 5 is a schematic block diagram illustrating another example embodiment of a signal chain component for generating a filtered output signal by tuning the center frequency and attenuation level of a tuneable notch filter.

FIGS. 6A and 6B are schematic circuit diagrams illustrating example embodiments of a notch filter circuit.

DETAILED DESCRIPTION

Figure 1:
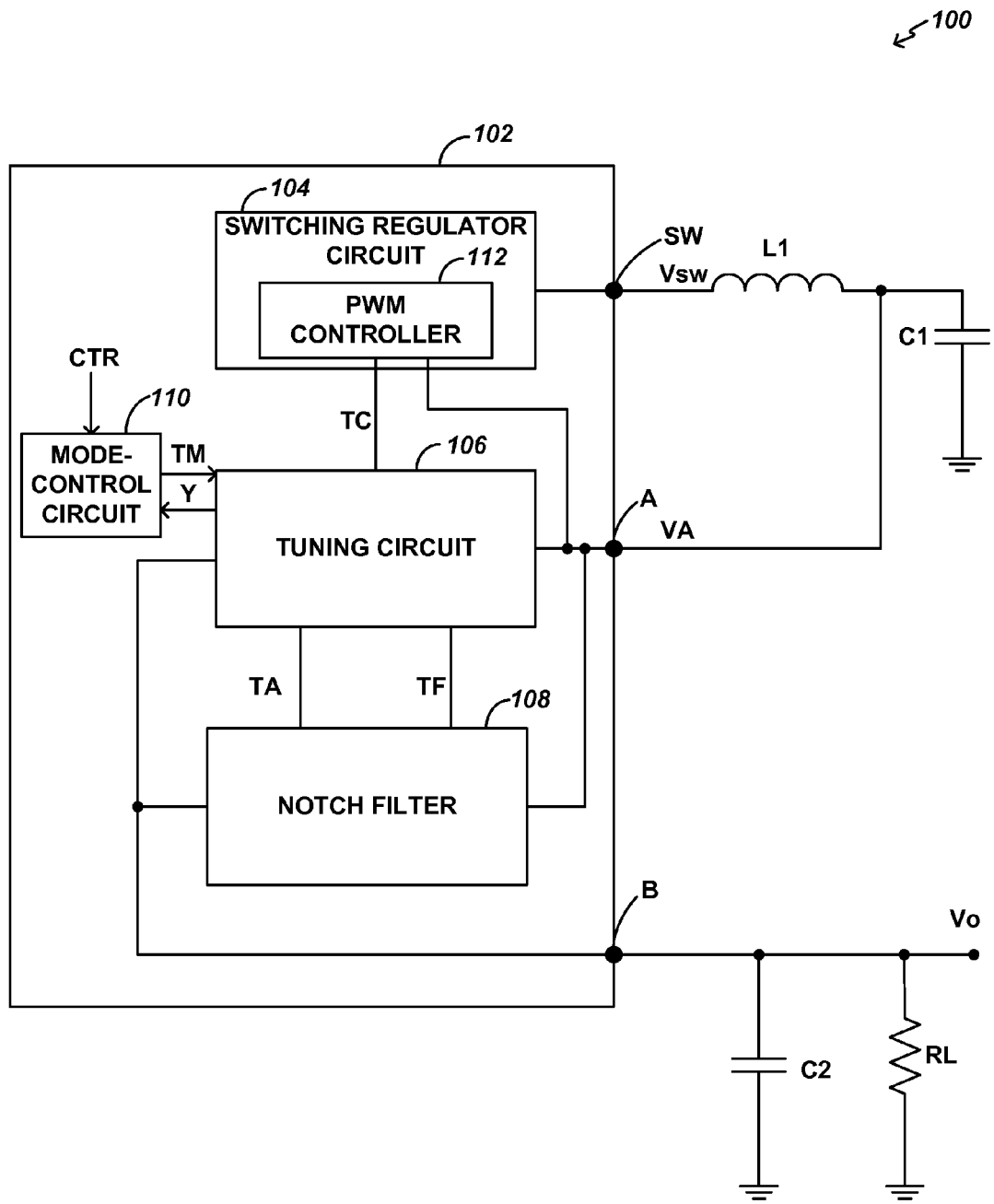
FIG. 1 is a schematic block diagram illustrating an electronic system for attenuating noise components of an output signal, in accordance with embodiments described herein.

The following detailed description of embodiments presents various descriptions of specific embodiments. However, the inventive subject matter can be embodied in a multitude of different ways as defined and covered by the claims. In this description, reference is made to the drawings where like reference characters may indicate identical or functionally similar elements.

Embodiments are described herein in the context of systems and methods applicable to, but not limited to, electronics and circuits associated with switching power regulators or converters and/or signal-chain circuitry. The following detailed description of various embodiments will be described below, by way of explanation, in the context of a buck regulator. It will be appreciated by one of ordinary skill, however, that alternative embodiments can include any switching regulator, such as boost or buck-boost switching regulators. Furthermore, it will be appreciated by one of ordinary skill that the systems and methods disclosed herein can be applicable to circuitry associated with power harvesting devices, mobile devices, sensors, detectors, transducers, and/or any device capable of producing an output signal having noise components to be attenuated.

A signal chain is a series of electronic components that receive input in tandem, with the output of one portion of the chain providing input to the next. Signal chains are often used in power supply and/or signal processing applications to provide electrical power supply and/or process data or to apply system controls. The input signal of the signal chain, or an intermediary signal of the signal chain, may include one or more noise components.

In particular, the operation of a switching regulator includes switching on and off one or more switching elements at a particular switching frequency, which causes the current in the regulator's storage inductor to increase and decrease at the switching frequency. This increasing and decreasing inductor current can cause a ripple component in the regulator's output voltage at one or more harmonics. This ripple component can be problematic, e.g., when the switching regulator's output voltage is driving an analog load, as the ripple frequencies typically get through the amplifier, analog-to-digital converter (ADC), and so forth and can corrupt the output signal. In example cases, the ripple is not broadband noise; rather, it can be coherently related to the switching regulator clock and is harmonically rich as determined by the switching frequency at which the regulator is running.

As output ripple is generally undesirable, many systems include circuitry designed to attenuate the ripple component. This can take the form of one or more low-pass filters made from various manifestations of capacitors, inductors, and/or ferrite beads. A linear post-regulator connected between the switching regulator's output and the load might also be used. The attenuation can be application-specific and can depend on the tolerance of the load to ripple.

To achieve a desired level of filtering, several stages can be used in series. A single inductor and capacitor connected in a low pass configuration can provide 12 dB/octave attenuation. However, attenuation on the order of 30 dB is often wanted. Use of cascaded low-pass filter stages can involve intermediate buffering, which increases cost, complexity, and additional sources of noise.

A notch-type filter might also be considered; however, aligning the resonant notch with the fundamental frequency of the ripple component can be difficult. For example, the fundamental frequency may be difficult to know beforehand because the fundamental frequency may vary with switching frequency and external effects, such as temperature and component degradation.

In example embodiments described herein, a notch filter can be arranged at the output of the switching regulator or any circuit generating a signal to be filtered to suppress noise of the output signal. The notch filter can attenuate a target noise component and pass secondary noise components. The notch filter need not filter secondary noise components because the secondary noise components can be filtered by components downstream to the notch filter or the secondary noise components may not have a substantial effect on performance. For example, the target noise component can be the noise component associated with the first harmonic of the regulator output caused by switching. Secondary noise components can correspond to higher frequency noise components, such as second or higher order harmonics and other noise sources. It will be appreciated that in alternative embodiments the target noise component can include components having a higher frequency than one or more of the secondary noise components.

In an example embodiment, the regulator's switching frequency and the notch filter's center frequency (e.g., resonance) should match in frequency to attenuate the target noise component at the first harmonic. At the resonance, the phase difference of the input and output of the notch filter is approximately 90°. This phase difference can be used as an error signal to provide an indication of the match between the center frequency of the notch filter and the noise components of the filtered signal. As such, phase information at the input of the notch filter and at the output of the notch filter can be detected and subtracted to generate a phase difference signal. A tuning circuit can adjust the switching frequency of the switching regulator and/or the center frequency of the notch filter to drive the error signal towards zero. By pushing the error signal close to zero, the automatic resonance tuning can be realized.

Furthermore, the notch filter can vary its attenuation level at the center frequency to improve either accuracy during tuning or to improve attenuation during filtering. As such, the notch filter can operate in either a filtering mode or a tuning mode. The notch filter can have a higher attenuation level during the filtering mode than it does during the tuning mode. In this way, operating with a low attenuation level during the tuning mode, the notch filter can reduce the attenuation of the target noise component so that secondary ("interfering") noise components do not substantially contribute to the error signal relative to the target noise component. If, on the other hand, the secondary noise components provide a substantial contribution to the error signal relative to the target noise component, then tuning can be inaccurate because the secondary noise components can corrupt the phase information of the target noise component. By operating with a high attenuation level during the filtering mode, the notch filter can increase the attenuation to the target noise component. The tuning can cease during the filtering mode so that the increased attenuation of the target noise component relative to the secondary noise components does not adversely change the center frequency. In this way, operating in two modes can improve filtering and tuning.

As described below, the attenuation level can be adjusted by changing the quality factor (Q-factor) of an inductor-capacitor (LC) tank/resonator used to implement a notch filter. For example, a switched resistor can be used to selectively add resistance to the LC tank and thus reduce its Q-factor. A reduced Q-factor can reduce the attenuation level of the LC tank. The switched resistor can be switched off so that the resistor provides substantially no resistance, thereby increasing the Q-factor and the attenuation level. In some embodiments, the Q-factor can also be changed to additionally or alternatively change the bandwidth of the notch filter.

FIG. 1 is a schematic block diagram illustrating an electronic system 100 for attenuating noise components of an output signal Vo, in accordance with embodiments described herein. The electronic system 100 includes an integrated circuit IC 102 having nodes SW, A, and B coupled to an inductor L1, capacitors C1, C2, and a resistor RL. The IC 102 includes a switching regulator circuit 104, a tuning circuit 106, a notch filter circuit 108, and a mode-control circuit 110. The switching regulator circuit 104 includes a pulse width modulation (PWM) controller 112.

As will be described in greater detail below, the PWM controller 112 controls the switching regulator circuit 104 to generate a switched signal Vsw at the node SW. The switched signal Vsw can include a target noise component and secondary noise components caused by the switching of the switching regulator circuit 104. The notch filter circuit 108 can filter the switched signal Vsw to attenuate the target noise component to produce the output signal Vo. Because the frequency of the target noise component may be unknown, may vary with respect to time, and/or may be difficult to match with the notch filter circuit 108 (e.g., due to variations of the components of the notch filter circuit 108), the tuning circuit 106 can monitor the input and output of the notch filter circuit 108 to adjust at least one of the switching regulator circuit 104 or the notch filter circuit 108 to match the frequency of the target noise component and the center frequency of the notch filter circuit 108 to improve attenuation of the target noise component. As such, in example embodiments, the tuning circuit 106 can facilitate automatic tuning of the electronic system 100 to improve attenuation of the noise components of Vo. Further details of the electronic system 100 will now described below.

In the illustrated example embodiment, the IC 102 can correspond to a monolithic IC coupled to the capacitors C1, C2, and the resistor RL. For example, the node SW of the IC 102 is coupled to a first end of the inductor L1. The node A of the IC 102 is coupled to a second end of the inductor L1 and a first end of the capacitor C1. The capacitor C1 has a second end coupled to ground. As such, the node SW provides the switched signal Vsw, and the node A receives the signal Va as feedback.

Furthermore, the node B of the IC 102 is coupled to the capacitor C2 and the resistor RL, which form a parallel connection to ground. As such, the node B can provide the output signal Vo. Additionally, the capacitor C2 can serve as a coupling capacitor coupled to the load (RL). Additionally, the components C2 and RL can form a low-pass filter that can attenuate at least a portion of the secondary noise components (e.g., high-order harmonics) of the output signal Vo.

Each of the nodes SW, A, and B can correspond to a physical pin, a pad, a port, a lead, a terminal, a contact, a connector, or a like node of the IC 102. It will be appreciated by one skilled in the art that the IC 102 can include additional or fewer components in alternative embodiments. For example, one or more of the switching regulator circuit 104, the tuning circuit 106, the notch filter circuit 108, or the mode-control circuit 110 can be separate components and/or external to the IC 102. Additionally or alternatively, one or more of the inductor L1, the capacitors C1, C2, or the resistor RL can be integrated by the IC 102 in alternative embodiments.

The switching regulator circuit 104 of the IC 102 can include circuitry to generate a switched signal Vsw at the node SW that charges the inductor L1 and the capacitor C1. The switching regulator circuit 104 switches at a frequency determined at least in part by the clock signal TC to produce the switched signal Vsw at the node SW. As such, the inductor L1 and the capacitor C1 can serve as a storage inductor and a storage capacitor, respectively. The voltage produced across the capacitor C1 can correspond to an intermediary power supply signal that can be filtered by the notch filter circuit 108 for producing the output signal Vo. The voltage across the capacitor C1 can also be fed back to the switching regulator circuit 104 as the signal VA for set-point regulation. In example embodiments, the switching regulator circuit 104 can correspond to a buck convertor, a boost convertor, or a buck-boost convertor.

The PWM controller 112 of the switching regulator circuit 104 can include circuitry to operate the switching of switching regulator circuit 104 to generate the switched signal Vsw as an output based on the signal VA and the clock signal TC. For example, the PWM controller 112 can compare the signal VA with a reference voltage (not shown) to determine a duty cycle of the switching relative to the clock signal TC to generate the output signal Vo at a level that matches the reference voltage. The duty cycle can correspond to the proportion of a period of the clock signal TC during which the switched signal Vsw is pulled to a high voltage (e.g., Vdd). During remainder of the period, the node SW can be coupled to a low voltage supply (e.g., Vss). Due to the output feedback configuration, the PWM controller 112 receives at the node A the signal VA that is generated based on the switched signal Vsw. Using the signal VA as a feedback signal can improve closed loop stability in comparison with using a feedback signal generated downstream of the notch filter 108 as a feedback signal.

In example embodiments, a sensing circuit (not shown), such as a voltage divider, can be coupled to the first end of the capacitor C1 for generating a feedback voltage to be provide to the PWM controller 112 instead of the signal VA.

In an alternative example embodiment, the output voltage Vo is fed back to the PWM controller 112 in addition, or in alternative, to feeding back the voltage VA. By using the output voltage Vo as a feedback signal, the switching regulator 104 directly regulates the output voltage to improve load current rejection and the accuracy of the output voltage Vo.

The notch filter circuit 108 can include circuitry to filter the signal VA to produce the output signal Vo. In operation, as discussed, the signal Vsw at node SW can be a rectangular wave which is harmonic rich due to the switching operation of the switching regulator circuit 104. The amplitudes of the harmonics can vary with the duty cycle of the switching regulator circuit 104. These harmonics can serve as unwanted noise components. The notch filter circuit 108 can filter the signal Vsw to attenuate the fundamental harmonic frequency component to produce the output signal Vo. After the notch filter circuit 108, while the fundamental frequency harmonic at node A can be attenuated, there can be residual second and/or high order harmonics at the node B. However, these second and/or higher order harmonics can be filtered by downstream components, such as, for example, the capacitor C2 and the resistor RL. In this way, the notch filter circuit 108 can serve to selectively attenuate the fundamental frequency but pass higher order frequencies.

The notch filter circuit 108 can have an input-output frequency response that includes a stopband region having a center frequency, an attenuation level, and a bandwidth. The attenuation level and, in some embodiments, the bandwidth of the stopband region can be varied in accordance with the attenuation-level signal TA. In example embodiments, the center frequency of the stopband region can be varied in accordance with the tuning signal TF. It will be appreciated by one skilled in the art that the center frequency of the notch filter circuit 108 can be non-adjustable or fixed in alternative embodiments.

The tuning circuit 106 can adjust at least one of the switching regulator circuit 104 or the notch filter circuit 108 to attenuate or improve the attenuation of noise components in the output signal Vo. For example, the tuning circuit 106 receives the input signal of the notch filter circuit 108 (e.g., VA), the output signal of the notch filter circuit 108 (e.g., Vo), and the mode signal TM as inputs and provides one or more of the clock signal TC, an attenuation-level signal TA, or a frequency signal TF as outputs. Furthermore, in example embodiments, the tuning circuit 106 may provide monitoring signals Y as an output. The clock signal TC, as stated, determines the switching frequency of the switching regulator circuit 104. The attenuation-level signal TA determines the attenuation level of the notch filter circuit 108. Examples of the attenuation level include the attenuation level at the center frequency and the bandwidth of the stopband region. The frequency signal TF determines the center-frequency characteristic of the notch filter circuit 108. In an example embodiment, adjusting the attenuation level and/or bandwidth of the notch filter circuit 108 does not substantially change the center frequency. The effects of adjusting the attenuation-level of the notch filter circuit 108 will be described in greater detail below in connection with FIGS. 2A and 2B.

Figure 2A:
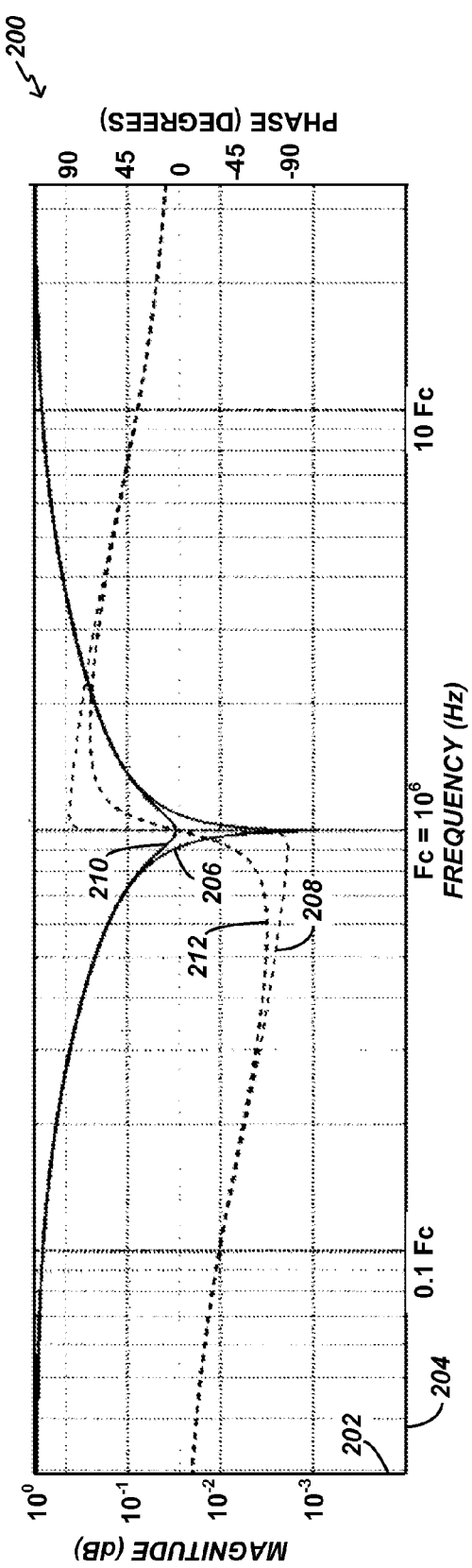
FIG. 2A includes Bode magnitude plots of an example embodiment of a notch filter for various Q-factors.

FIG. 2A includes Bode plots 200 of an example embodiment of a notch filter for various Q-factors. In an example embodiment, the Bode plots 200 can correspond to the notch filter circuit 108 of FIG. 1 having an adjustable attenuation level via an adjustable Q-factor characteristic, in accordance with the attenuation-level signal TA. The vertical axis 202 of the Bode plots 200 represents magnitude in decibels (dB), and the horizontal axis 204 represents frequency in Hertz (Hz). The Bode plots 200 include a plurality of responses 206-212 of the notch filter for various selections of the Q-factor of the notch filter.

The responses 206, 208 correspond to a first Q-factor and the responses 210, 212 correspond to a second Q-factor, where the first Q-factor is greater than the second Q-factor. In particular, the response 206 represents the Bode magnitude response of the notch filter having the first Q-factor and a center frequency at Fc=$10^6$ Hz. The response 208 represents the Bode phase response of the notch filter having the first Q-factor. The response 210 represents the Bode magnitude response of the notch filter having the second Q-factor and the same center frequency at Fc=$10^6$ Hz. The response 212 represents the Bode phase response of the notch filter having the second Q-factor.

FIG. 2A shows that the peak attenuation of the notch filter can be adjusted by adjusting the Q-factor of the notch filter. As shown in the illustrated embodiment of FIG. 2A, as the Q-factor increases, the attenuation at the center frequency Fc increases. Accordingly, the notch filter can be adjusted to have low peak attenuation via a low Q-factor or to have a high peak attenuation via a high Q-factor.

Figure 2B:
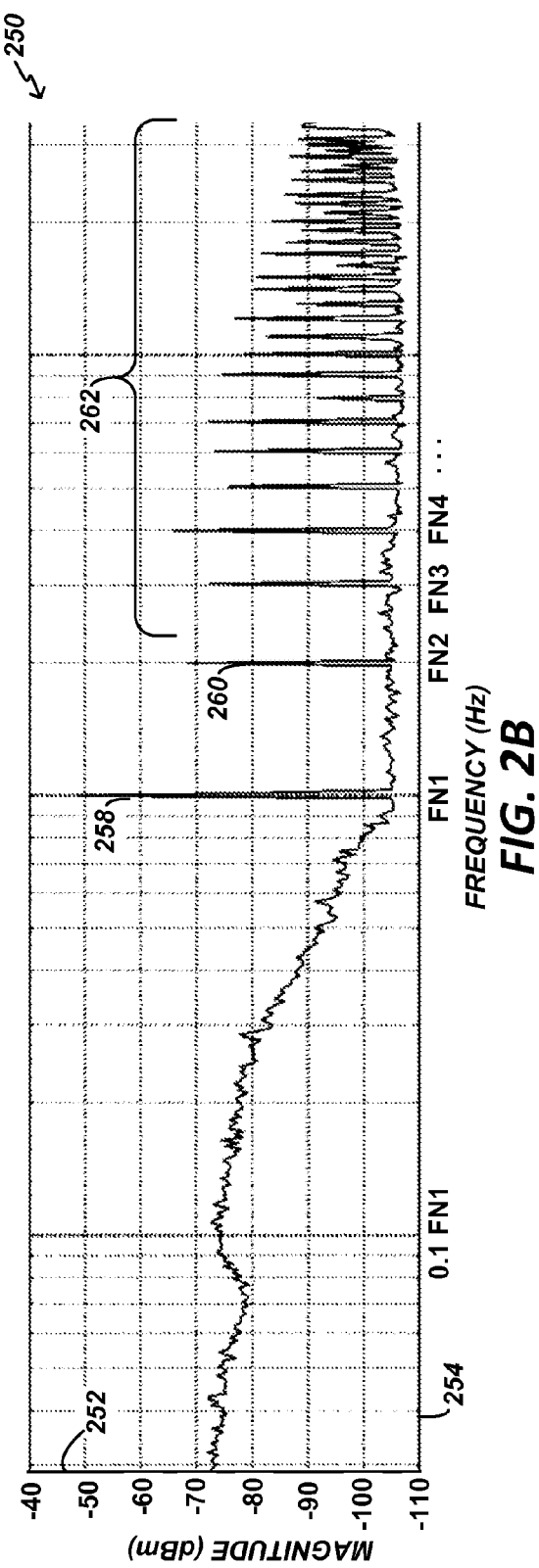
FIG. 2B is a plot of a frequency spectrum of an example embodiment of a signal to be filtered by a notch filter having the response shown in FIG. 2A.

FIG. 2B is a plot 250 of a frequency spectrum of an example embodiment of a signal to be filtered by a notch filter having a response shown in FIG. 2A. For example, the frequency spectrum of the plot 250 can correspond to the signal VA provided by the switching regulator circuit 104 at the node A of FIG. 1, or it can correspond to any signal provided to the node A that is to be filtered by the notch filter circuit 108. The vertical axis 252 of the plot 250 represents the magnitude of the frequency spectrum in decibel milliwatts (dBm). The horizontal axis 254 of the plot 250 represents frequency in Hz. The frequency spectrum of the plot 250 includes a plurality of noise components to 258-262.

The noise components 258-262 can have respective center frequencies FN1, FN2, FN3, FN4, and so on. In an example embodiment, the center frequency FN1 can represent the first or fundamental harmonic. The center frequency FN2 can represent the second harmonic. The remaining center frequencies FN3, FN4, and so on of the noise components 262 can represent third-order and higher harmonics. The noise components 258-262 can correspond to harmonics created by a switching circuit (e.g., the switching of the switching regulator circuit 104 of FIG. 1). As such, the center frequencies FN1, FN2, FN3, FN4 can be based on the frequency of the clock signal TC. It will be appreciated by one of ordinary skill in the art that in alternative embodiments the noise components 258-262 need not correspond to switching harmonics but can instead correspond to any suitable noise source.

In an example embodiment, the signal represented by the plot 250 can be filtered by the notch filter circuit 108 of FIG. 1 and have a magnitude frequency responses 206 or 210 of FIG. 2A. For example, the notch filter circuit 108 can receive the signal of plot 250 and provide the output signal Vo at the node B. As described in connection with FIGS. 1 and 2A, the notch filter circuit 108 can have an adjustable attenuation level. Moreover, in an example embodiment, the frequency of the center frequency of the notch filter can be adjusted via the center frequency signal TF. Additionally or alternatively, one or more of the center frequencies FN1, . . . , FN4 can be adjusted via the clock signal TC. Thus, the center frequency FC of FIG. 2A and/or the center frequency FN1 of the noise component 258 can be adjusted to improve attenuation of one or more of the noise components 258-262.

Each of the noise components to 258-262 can correspond to either a target noise component and/or a secondary noise component. For example, the noise component 258 can correspond to a target noise component that is to be filtered by a notch filter circuit 108 of FIG. 1. The noise components 260, 262 can correspond to secondary noise components, which can correspond to noise components that the notch filter need not attenuate. For instance, the noise components 260, 262 can be filtered by components downstream of the notch filter circuit 108 of FIG. 1, and/or the noise components 260, 262 do not have a substantial effect on system performance. Substantially attenuating the target noise component (e.g., noise component 258) and not the secondary noise components (e.g., noise components 260, 262) can be achieved by using a high attenuation level at FC=FN1 (e.g., matching FN1 to Fc of FIG. 1).

In operation, the tuning circuit 106 of FIG. 1 can monitor the performance of the notch filter circuit 108 to tune either the center frequency of the notch filter circuit 108 and/or the center frequency of the noise components such that the center frequency of the target noise component is within the bandwidth of the notch filter circuit 108. In an example embodiment, performance can be monitored by comparing the input and the output (via nodes A and B) of the notch filter circuit 108.

However, as will be described later in greater detail, the secondary noise components can act as a "tuning disturbance." As stated, the tuning circuit 106 compares VA and Vo to detect the phase difference of the noise component 258 (e.g., the target noise component) between node A and node B. At node B, the noise component 258 can be highly attenuated if the noise component 258 is within the bandwidth of the notch filter circuit 108 and the attenuation level is set high. In contrast, the noise components 260, 262 may not be substantially attenuated if the noise components 260, 262 are outside the bandwidth of the notch filter circuit 108. In this case, at the output of the notch filter circuit 108, the contributions of the noise components 260, 262 can be substantial in comparison to the contribution of the attenuated version of the noise component 258. Thus, when comparing VA to Vo, the tuning circuit 106 may inaccurately measure the phase difference of the noise component 258 between nodes A and B.

While substantially attenuating the target noise component may be desirable for filtering operation, such a scenario may cause inaccuracies in tuning the notch filter circuit 108 as described above. On the other hand, while decreasing the attenuation level of the notch filer 108 such that the noise component 258 at node B has a large contribution relative the noise component 260, 262 can improve tuning performance, it may decrease filtering performance.

Accordingly, the attenuation level of the notch filter circuit 108 can be selected to improve filtering performance or to improve tuning performance. As stated, filtering performance can correspond to the amount that the notch filter attenuates the target noise component. Tuning performance can correspond to the accuracy of the matching of the center frequency of the notch filter circuit 108 and the frequency of the target noise component. In some example cases, as illustrated above in connection with FIGS. 2A and 2B, there is a tradeoff between filtering performance and tuning performance.

Returning to FIG. 1, the tuning circuit 106 can operate in various modes to generate the tuning signals TC, TA, and/or TF in a way that manages the tradeoffs dynamically during operation. The tuning circuit 106 can select the mode in accordance with the mode signal TM. Example modes can include a tuning mode and a filtering mode. In the tuning mode, the tuning circuit 106 monitors the performance of the notch filter circuit 108 and adjusts the notch filter circuit 108 and/or the tuning circuit 106 to approximately match the fundamental frequency of the signal VA and the center frequency of the notch filter circuit 108. In this mode, the tuning circuit 106 adjusts the attenuation level of the notch filter circuit 108 to improve tuning performance, such as, e.g., with respect to the accuracy of detecting the frequency of the fundamental noise components to be filtered. In this way, tuning performance is emphasized over filtering performance.

The tuning circuit 106, operating in the tuning mode, generates or adjusts the clock signal TC and/or the center frequency TF based on the signal VA and the output signal Vo to match the center frequency of the stopband region with the frequency of the signal component of the power supply signal. In an example embodiment, the tuning circuit 106 tunes the clock signal TC and not the center frequency signal TF. Tuning the clock signal TC and not the center frequency signal TF can serve to reduce the complexity of the notch filter and/or can serve to increase the range of tunability of the electronic system 100.

In another example embodiment, the tuning circuit 106 tunes the center frequency signal TF and not the clock signal TC. Tuning the center frequency signal TF and not the clock signal TC can facilitate tuning in a wider range of applications, such as applications in which the clock signal TC does not exist or cannot or should not be adjusted.

In the filtering mode, the tuning circuit 106 configures the notch filter circuit 108 to increase filtering performance relative to the tuning mode. In this mode, the tuning circuit 106 emphasizes filtering performance over tuning performance by selecting the attenuation-level signal TA that provides a higher attenuation level at the center frequency of the notch filter circuit 108 relative to the tuning mode. An another example embodiment, in the filtering mode, the tuning circuit 106 emphasizes filtering performance over tuning performance by selecting the attenuation-level signal TA that provides a narrow bandwidth of the notch filter circuit 108 relative to the tuning mode. Decreasing the bandwidth of the notch filter circuit 108 can serve to increase the level of attenuation about the center frequency. This can be true because decreasing the bandwidth of the stopband region, e.g., by increasing the Q-factor of the notch filter circuit 108, can increase the attenuation at the center frequency of the band stop region.

In example embodiments, the tuning circuit 106 ceases tuning and holds or maintains the clock signal TC at substantially constant value while operating in the filtering mode. Ceasing tuning while in the filtering mode can serve to inhibit inaccurate tuning resulting from the increased attenuation of the target noise component relative to secondary noise components caused by filtering, as discussed above in greater detail.

In the illustrated example embodiment of FIG. 1, the tuning circuit 106 provides the clock signal TC as an output to the PWM controller 112. It will be appreciated by a person of ordinary skill in the art that in alternative embodiments the switching regulator circuit 104 can generate the clock signal TC internally and/or the clock signal TC can be generated by a circuit different from the tuning circuit 106 (e.g., an oscillator circuit (not shown)) and/or not based on the signal VA. In other words, in some example embodiments, the tuning circuit 106 does not adjust or provide the clock signal TC. In this case, the tuning circuit 106 can adjust the frequency signal TF to match the center frequency of the notch filter circuit 108 to the frequency of the target noise component.

For instance, the tuning circuit 106 can adjust the frequency signal TF based on the input and the output of the notch filter circuit 108. In example embodiments, the tuning circuit 106 ceases tuning and holds or maintains the frequency signal TF at substantially constant value while operating in the filtering mode. Ceasing tuning while in the filtering mode can serve to inhibit inaccurate tuning resulting from the increased attenuation of the target noise component relative to secondary noise components caused by filtering. Example embodiments of the tuning circuit 106 and tunable notch filter circuit 108 will be described in greater detail in connection with FIGS. 4 and 5.

The mode control circuit 110 includes circuitry to generate the mode signal TM for selecting the mode of operation of the tuning circuit 106. The mode signal TM can be a digital or analog signal. For example, the mode signal TM can be a binary signal having a first state for indicating the tuning mode and a second state for indicating the filter mode. In another example embodiment, the mode signal TM can be a digital signal or an analog signal for indicating the filtering mode, the tuning mode, and one or more additional states. The additional states may correspond to states in which the notch filter 108 switches in a resistance having a value between the resistance provided in the filtering mode and the tuning mode. The additional states can facilitate providing multiple tuning modes and/or provide a way to smoothly or incrementally switch (e.g., soft switching) between the tuning mode to the filtering mode, e.g., to reduce the effects of signals with large discontinuities and switching disturbances seen at the output signal Vo.

The mode-control circuit 110 can generate the mode signal TM based on a control signal CTR and/or monitoring signal Y. For example, the control signal CTR can correspond to one or more signals indicative of start-up, initialization, calibration, recalibration, and/or the like commands of the electronic system 100. The control signal CTR can be provided by an external circuit (not shown). In response to the control signal CTR indicating of one or more of the commands, the mode-control circuit 110 can generate the mode signal TM to indicate a tuning mode.

The monitoring signal Y can include one or more signals indicative of the performance of the tuning circuit 106 and/or the notch filter circuit 108, such as an error signal, the clock signal TC, and/or the center frequency signal TF. The mode-control circuit 110 can process the monitoring signal Y to determine whether the mode signal TM is to be generated to indicate either the filtering mode or the tuning mode. Example embodiments of mode-control circuit 110 will be described in greater detail in connection with FIGS. 7-9.

In an example embodiment, the bandwidth of the notch filter can be adjusted in addition or as an alternative to adjusting the attenuation of the center frequency. For example, the bandwidth of example embodiments of the notch filter circuit 108 can be based on the center frequency Fc and the Q-factor of the notch filter circuit 108. For example, the bandwidth can be approximated according to the following equation:

$$BW \approx F2 - F1 \approx \frac{Fc}{Q} \quad \text{(EQ. 1)}$$

In Equation 1, BW represents the bandwidth, F1 and F2 represent the lower and upper cut-off frequencies, Fc represents the center frequency, and Q represents the Q-factor. Thus, the bandwidth BW of the notch filter circuit 108 can be adjusted by changing the Q-factor of the notch filter circuit 108 while substantially maintaining the center frequency Fc. Adjusting the bandwidth can facilitate lowering the attenuation of the target noise component and attenuating, e.g., the second harmonic during operation in the tuning mode. This can have the effect of improving tuning accuracy.

Figure 3:
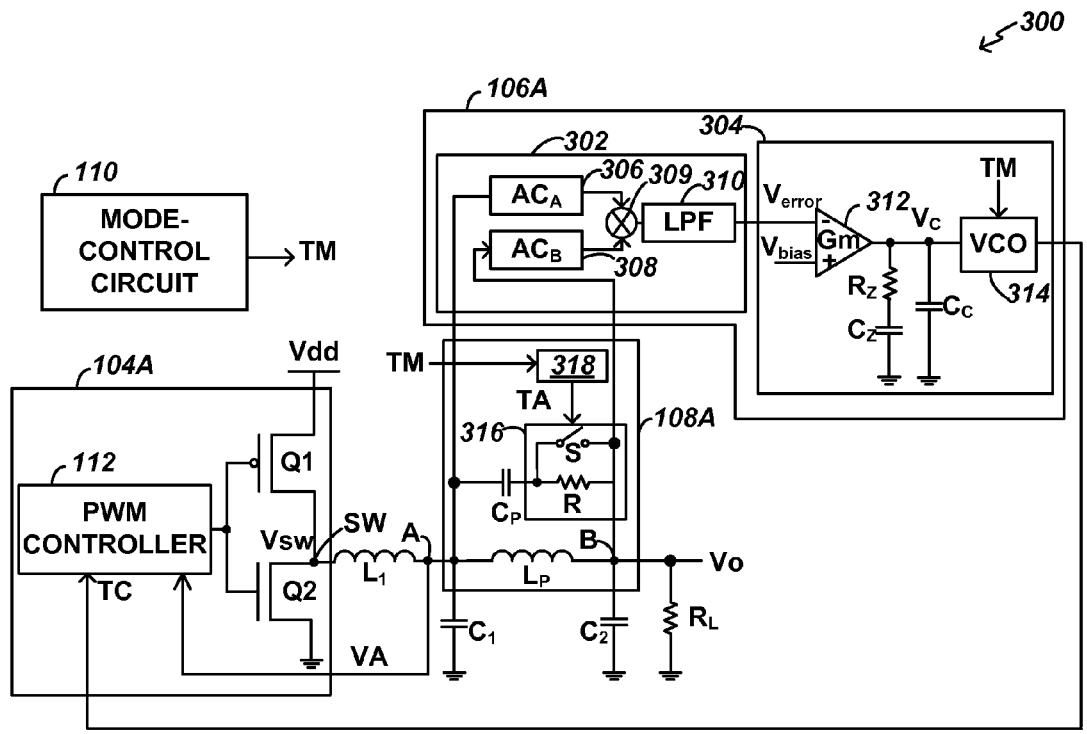
FIG. 3 is a schematic block diagram illustrating an example embodiment of a power regulator system for generating a reference voltage by tuning a clock signal.

FIG. 3 is a schematic block diagram illustrating an example embodiment of a power regulator system 300 for generating an output voltage Vo by tuning a clock signal TC. The power regulator system 300 can correspond to an example embodiment of the electronic system 100 of FIG. 1. Elements common to the schematics of FIGS. 1 and 3 share common reference indicia, and only differences between the schematics are described herein for the sake of brevity.

For instance, FIG. 3 shows details of a switching regulator circuit 104A, a tuning circuit 106A, and a notch filter circuit 108A, which components correspond to particular embodiments of the components 104, 106, 108, respectively, of FIG. 1. The switching regulator circuit 104 includes the PWM controller 112 coupled to the transistors Q1, Q2. The tuning circuit 106A, being coupled to the input and output of the notch filter circuit 108A, includes a phase detector circuit 302 and an adjustment circuit 304 to generate the clock signal TC for adjusting the switching regulator circuit 104A. The phase detector circuit 302 includes AC coupling circuits 306, 308, a multiplier 309, and a low-pass filter 310. The adjustment circuit 304 includes an amplifier 312, a resistor Rz, a capacitor Cz, a capacitor Cc, and a voltage-controlled oscillator (VCO) 314. The notch filter circuit 108A, being coupled to the node A to receive the signal VA via the inductor L1, includes a switched resistor 316, a switch control circuit 318, a capacitor Cp, and an inductor Lp to provide an output signal Vo at the node B. The switched resistor 316 includes a switch S and a resistor R. The mode control circuit 110 is coupled to the switch control circuit 318 to provide the mode signal TM to the switch control circuit 318 and the VCO 314. The inductor L1, capacitors C1, C2, and the resistor RL are arranged as described above in connection with FIG. 1. It will be appreciated by one skilled in the art that sub-elements of the elements of FIG. 3 can be included alternatively in any element of FIG. 3. For example, the adjustment logic circuit 318 can be included by the tuning circuit 106A instead of the notch filter circuit 108A in alternative embodiments.

The PWM controller 112 of the switching regulator circuit 104A includes an output coupled to the gates of the transistors Q1, Q2, which serve as switches to selectively couple either the power supply Vdd or ground to the node SW. For example, the transistor Q1 can correspond to a p-channel MOSFET having a source coupled to the power supply Vdd, a drain coupled to the node SW, and a gate coupled to the output of the PWM controller 112. The transistor Q2 can correspond to an n-channel MOSFET having a drain coupled to the node SW, a source coupled to ground, and a gate coupled to the output of the PWM controller 112. Accordingly, the PWM controller 112 can set the gates of the transistors Q1, Q2 to LOW for coupling the node SW to the power supply VDD, and can assert the gates of the transistors Q1, Q2 to HIGH for coupling the node SW to ground. The PWM controller 112 can be configured such that the PWM controller 112 closes at most one of the transistors Q1, Q2 at any given time and thus inhibits coupling the power source Vdd directly to ground via the transistors Q1, Q2.

At node SW, the switching regulator circuit 104 can be coupled to a series connection of an inductor L1 and capacitor C1 forming an LC circuit. The PWM controller 112 receives the signal VA as feedback at node A between the inductor L1 and the capacitor C1. The PWM controller 112 also receives a clock signal TC from the tuning circuit 106A. The PWM controller 112 selectively couples the power supply Vdd to the node SW for a duty cycle of a period of the clock signal TC, and connects the node SW to ground for the remainder of the period of the clock signal TC. The duty cycle can be determined based at least on the signal VA. For example, the PWM controller 112 can compare the signal VA to a signal (not shown) indicative of the desired output level to determine the duty cycle.

As stated, the output voltage Vo can be fed back to the PWM controller 112, as well as feeding back the voltage VA in an alternative example embodiment. By using the output voltage Vo as a feedback signal, the switching regulator 104A directly regulates the output voltage to improve load current rejection and the accuracy of the output voltage Vo.

The notch filter circuit 108A receives a power supply signal (e.g., corresponding to the signal VA) from the output of the inductor L1 at the node A to generate a filtered output signal Vo. In particular, the inductor LP has a first end coupled to node A and a second end coupled to node B. The capacitor CP has a first end coupled to node A and a second end coupled to a first end of the switched resistor 316. The switched resistor 316 has a second end coupled to the node B. In this arrangement, the inductor LP, the capacitor CP, and the switched resistor 316 form a resistor-inductor-capacitor (RLC) tank that passes signals from the node A to the node B and attenuates frequencies about the RLC tank's resonance frequency. The Q-factor of the RLC tank is based at least on the resistance provided by the switched resistor 316.

The switched resistor 316 of the notch filter circuit 108A includes the switch S and the resistor R arranged such that the switched resistor 316 selectively provides a resistance based on the attenuation-level signal TA. For example, the switch S provides the resistance of the resistor R in response to the switch S being open. Alternatively, the switch S provides substantially no resistance in response to the switch S being closed by shorting the resistor R. As such, the switched resistor 316 can serve to vary or adjust the attenuation level of the stopband region of the notch filter circuit 108A. Because increasing the resistance provided by the switched resistor decreases the Q-factor of the notch filter circuit 108A, opening the switch S of the switched resistor 316 provides a resistance and decreases the attenuation level of the notch filter circuit 108 relative to the attenuation level of the notch filter circuit 108A when the switch S of the switched resistor 316 is closed.

It will be appreciated by one of ordinary skill that the switch S and the resistor R need not be, but can be, separate physical elements. The switch S and resistor R can represent a model the electrical characteristic of the switched resistor 316. Accordingly, the switched resistor 316 can include discrete switch S and resistor R elements arranged as shown in FIG. 3. Alternatively, the switched resistor 316 can be embodied by one or more field-effect transistors ((FET); not shown) without a separate resistor element, and the switched resistor 316 can switch the FET between a triode mode of operation (e.g., corresponding to the switch S being open) and a saturation mode of operation (e.g., corresponding to the switch S being closed). In such an example embodiment, the gate voltage of the FET can be set to a voltage level that results in the desired resistance modeled by the resistor R. Implementing the switch resistor with a FET can facilitate adjustment of the resistance of the switched resistor 316 via a control signal and without physically changing components of the notch filter circuit 108A.

The switch control circuit 318 can include circuitry to receive the mode signal TM as an input and to generate the attenuation-level signal TA as an output based on the mode signal TM. For example, the mode signal TM can be a digital signal to indicate either a filtering mode or a tuning mode. The switch control circuit 318 can include circuitry to receive the digital mode signal TM and to generate an analog attenuation-level signal TA to drive the switch S. As stated above, the switch S can correspond to one or more transistors arranged to form the switch S. As such, the switch control circuit 318 can generate the attenuation-level signal TA to drive the gates of the transistors to turn on or off the switch S or to overdrive the transistors in a way to generate two or more levels of resistance based on the mode signal TM. In an alternative embodiment, the switch control circuit 318 can receive an analog mode signal TM and can generate the attenuation signal TA to overdrive the gate of the transistors at a level to generate a resistance level based on the mode signal TM.

Accordingly, the switch control circuit 318 can operate the switched resistor 316 to achieve the attenuation level corresponding to the selected filtering mode or the tuning mode. As stated, the filtering mode corresponds to an attenuation level that is higher than the attenuation level of the tuning mode. In connection with the example embodiment of FIG. 3, the switch control circuit 318 can open the switch S in response to receiving the mode signal TM corresponding to the tuning mode. Furthermore, the switch control circuit 318 can close the switch S in response to receiving the mode signal TM that is indicative to the filtering mode.

As stated, the tuning circuit 106A monitors the performance of the notch filter circuit 108A and adjusts the clock signal TC to substantially match the frequency of the target noise component to the center frequency of the notch filter circuit 108A. In particular, the phase detector circuit 302 includes the AC coupling circuits 306, 308, the multiplier 309, and the low-pass filter 310 arranged to generate an error signal Verror based at least on the input and output of the notch filter circuit 108A. In particular, the AC coupling circuit 306 has an input coupled to the node A and an output coupled to a first input of the multiplier 309. Additionally, the AC coupling circuit 308 has an input coupled to the node B and an output coupled to a second input of the multiplier 309. The output of the multiplier 309 is coupled to an input of the low-pass filter 310, which provides the error signal Verror.

The error signal Verror can be indicative of the phase difference between the input and the output of the notch filter circuit 108A. For instance, the target noise component at the node A should generate a response at the node B by the notch filter circuit 108 that is about 90 degrees out of phase with the target noise component at node A when the frequencies of the target noise component and the notch filter circuit 108A substantially match.

The AC coupling circuits 306, 308 can each correspond to circuitry for passing the AC component of a signal and for blocking the DC component of the signal. In an example embodiment, each of the AC coupling circuits 306, 308 can correspond to a capacitor having a first end to receive the input signal of the corresponding AC coupling circuits 306, 308 and a second end to provide the output signal of the corresponding AC coupling circuits 306, 308.

The multiplier 309 of the phase detector circuit 302 can correspond to any suitable circuitry for generating an output signal that is approximately the product of two input signals. In example embodiments, the multiplier 309 can correspond to an analog multiplier, a voltage controlled amplifier, a modulator, or a frequency mixer.

In operation, the output of the multiplier 309 can serve to be indicative of the phase difference of the target noise component with the center frequency of the notch filter circuit 108A. In particular, the signal VA at node A and the output signal Vo at the node B can be approximated by the following equations:

$$V_A(t) = \sum_{n=1}^{\infty} a_n \sin(n\omega t + \phi_n) \quad \text{(EQ. 2)}$$

$$V_o(t) = \sum_{m=1}^{\infty} b_m \sin(m\omega t + \phi_m) \quad \text{(EQ. 3)}$$

In Equations 2 and 3, the coefficients an represent amplitudes of the harmonics at the node A. The coefficients $\phi_n$ represent phases of the harmonics at the node A. The coefficients bn represent amplitudes of the harmonics at the node B. The coefficients $\phi_n$ represent phases of the harmonics at the node B. Accordingly, the output of the multiplier 309 can be approximated by the following equation:

$$Multiplier_{out} = \sum_{n=1}^{\infty} a_n \sin(n\omega t + \phi_n) \cdot \sum_{m=1}^{\infty} b_m \sin(m\omega t + \phi_m) \quad \text{(EQ. 4)}$$

The direct current (DC) component (e.g., low frequency term) of the multiplier output, which can correspond to the output (e.g., Verror) of the low-pass filter 310, can be rewritten as:

$$V_{error}(t) = \frac{a_1 b_1}{2}\cos(\varphi_1 - \phi_1) + \sum_{n=2}^{\infty} \frac{a_n b_n}{2}\cos(\varphi_n - \phi_n) \quad \text{(EQ. 5)}$$

In Equation 5, the first $$\frac{a_1 b_1}{2}\cos(\varphi_1 - \phi_1)$$

term represents the error contribution of the first harmonic, which can correspond to the target noise component. The second term $$\sum_{n=2}^{\infty} \frac{a_n b_n}{2}\cos(\varphi_n - \phi_n)$$

can represent the higher order harmonics, which can correspond to the secondary noise components. Without considering the higher order harmonics, the loop pushes the Verror signal close to zero, which means $\phi_1 - \phi_1$ is about 90 degrees. As a result, automatic resonance tuning can be achieved.

The second term of Equation 5 can add a tuning error to the error signal Verror that can affect the tuning accuracy. For example, when the notch filter circuit 108A attenuates the target noise component by using a high attenuation level, the first term of Equation 5 can be reduced relative to the second term because the notch filter circuit 108A attenuates the target noise component to a greater degree than the secondary noise components. Accordingly, the notch filter's 108A Q-factor can be reduced by putting the resistor R in series with the capacitor Cp in the tuning mode. Accordingly, a lower attenuation level can attenuate the target noise component less and, in some embodiments, can attenuate the secondary noise component more. As a result, the first term of the Equation 5 can be greater relative to the second term, and tuning accuracy can be improved. After the tuning, the resistor R can be shunted with the switch S and the Q-factor becomes large again, thereby improving filtering performance.

The low-pass filter 310 of the phase detector circuit 302 can correspond to any suitable circuitry that passes signals with a frequency lower than a certain cutoff frequency and attenuates signals with frequencies higher than the cutoff frequency. The low-pass filter 310 can correspond to an analog filter or a digital filter. The low-pass filter 310 can serve to remove signal components of the multiplier output signal so that the error signal Verror corresponds to approximately the DC component of the multiplier 309 output.

The adjustment circuit 304 includes the amplifier 312, the resistor Rz, the capacitor Cz, the capacitor Cc, and the VCO 314 arranged to generate the clock signal TC based at least on the error signal Verror. As such, the adjustment circuit 304 can correspond to a feedback control circuit (e.g., a set-point regulator) that can adjust the clock signal TC until the error signal Verror matches Vbias (e.g., Verror=0 if Vbias is connected to ground). In particular, the amplifier 312 can correspond to a transconductance amplifier having a gain Gm. The inverting terminal of the amplifier 312 can receive the error signal, and the non-inverting input of the amplifier 312 can receive a bias voltage. The output of the amplifier 312 can be coupled to the input of the VCO 314. The output of the amplifier 312 can also be coupled to a compensation network formed by the capacitor Cc connected to ground and in parallel connection with the resistor Rz in series with the capacitor Cz. The resistor RZ, the capacitor CZ, and the capacitor Cc can be selected to achieve a desired closed loop response (e.g., steady state error, loop gain, phase margin, response time, and the like characteristics).

The VCO 314 of the adjustment circuit 304 can receive the compensation signal Vc from the output of the amplifier 312. The compensation signal Vc can be indicative of a frequency for the clock signal TC. The VCO 314 can be configured to generate the clock signal TC based on the compensation signal VC.

In an example embodiment, the mode control circuit 110 provides the mode signal TM to a control input of the VCO 314 of the tuning circuit 106. In response to receiving the mode signal TM that is indicative of the filtering mode, the VCO 314 latches the compensation signal Vc and provides the clock signal TC at a fixed frequency. As such, tuning ceases and the notch filter circuit 108A operates with a high attenuation level.

Figure 4:
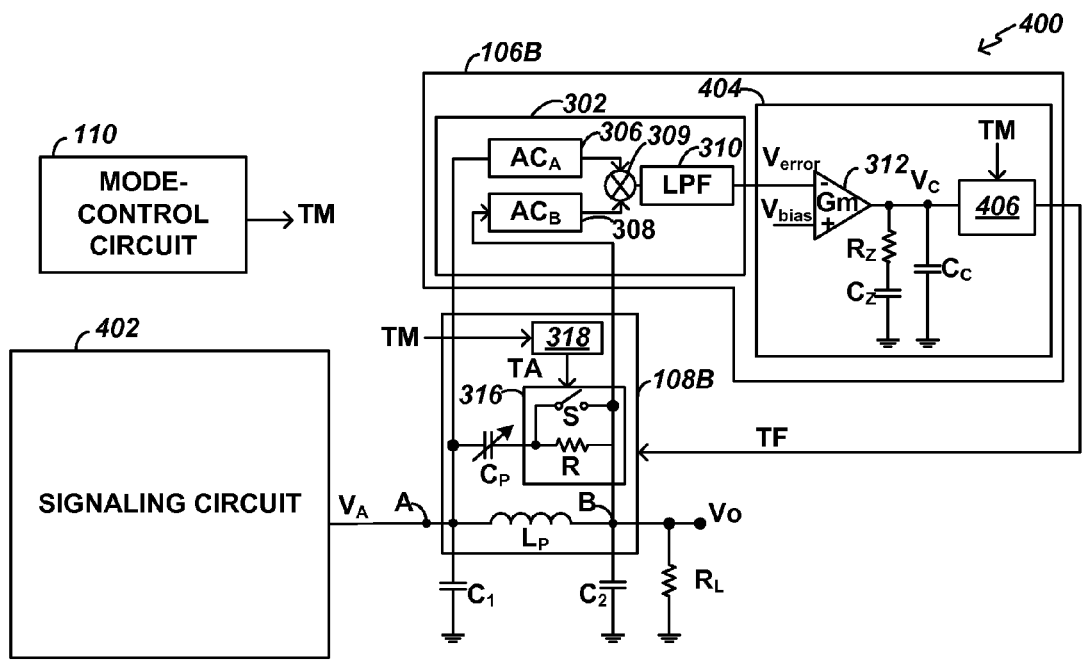
FIG. 4 is a schematic block diagram illustrating an example embodiment of a signal chain component for generating a filtered output signal by tuning the center frequency and attenuation level of a tuneable notch filter.

FIG. 4 is a schematic block diagram illustrating an example embodiment of a signal chain component 400 for generating a filtered output signal Vo by tuning the center frequency and attenuation level of a tuneable notch filter circuit 108B. Elements common to the schematics of FIGS. 1, 3, and 4 share common reference indicia, and only differences between the schematics are described herein for the sake of brevity.

FIG. 4 shows details of a tuning circuit 106B and a notch filter circuit 108B, which components correspond to particular embodiments of the components 106, 108, respectively, of FIG. 1. The signal chain component 400 includes a signaling circuit 402 that generates a signal VA provided at the node A. The signaling circuit 402 can correspond to any circuit suitable for generating a signal VA as an output that can contain noise components to be attenuated. In an example embodiment, the signaling circuit 402 can correspond to a switching regulator circuit, such as the switching regulator circuit 104 of FIG. 3.

In the illustrated example embodiment of FIG. 4, the adjustment circuit 404 of the tuning circuit 106B generates the center frequency signal TF based on the error signal Verror generated by the phase detector circuit 302. As such, the adjustment circuit 404 can correspond to a feedback regulator control circuit that can adjust the center frequency signal TF until the error signal Verror matches Vbias (e.g., Verror=0 if Vbias is connected to ground). In particular, the adjustment circuit 404 includes the amplifier 312, the resistor Rz, the capacitors Cz, Cc, and a control circuit 406. The control circuit 406 can include circuitry for receiving the compensation circuit output Vc as an input and can receive the mode signal TM as a control input. Moreover, the control circuit 406 can provide the center frequency signal TF based on compensation circuit output VC and the mode signal TM. For instance, the control circuit 406 can pass the compensation signal VC as the center frequency signal TF in response to the mode signal TM indicating a selection of the tuning mode. Additionally, the control circuit 406 can latch the compensation signal VC to generate a fixed center frequency signal TF in response to the mode signal TM indicating a selection of the filtering mode.

The notch filter circuit 108B includes a variable capacitor Cp that can present a capacitance based on the center frequency signal TF. Accordingly, the notch filter circuit 108B can receive the center frequency signal TF as an input. The center frequency signal TF can be used to adjust the capacitance presented by the variable capacitor CP to adjust the center frequency of the notch filter circuit 108B. Accordingly, the tuning circuit 106B can adjust the center frequency signal TF to match the target noise component to the center frequency of the notch filter circuit 108B.

The variable capacitor CP can be any suitable circuit and/or device capable of presenting a controllable capacitance. The variable capacitor Cp can correspond to any electrically controlled (digital or analog) variable capacitor, such as a p-n junction structure (e.g., a diode or transistor), a Barium Strontium Titanate (BST) capacitor, a micro-electro-mechanical (MEM) variable capacitor, and a capacitor array (e.g., metal-isolator-metal (MIM) capacitor and silicon-on-insulator/silicon-on-sapphire (SOI/SOS) switches). The variable capacitor Cp can be connected in series with a fixed capacitance (not shown) to serve as a DC block. Accordingly, a DC voltage can then be applied to the variable capacitor (via control signal TF, for example) to adjust its capacitance. It will be appreciated by one of ordinary skill in the art that embodiments that utilize a digitally controlled variable capacitor, the variable capacitor CP can interface with an analog-to-digital converter (not shown) that receives the analog signal TF and produces a digital signal to tune the variable capacitor CP. Example circuits for realizing a digitally controlled variable capacitor CP will be described in greater detail later in connection with FIGS. 11 and 12.

FIG. 5 is a schematic block diagram illustrating another example embodiment of a signal chain component 500 for generating a filtered output signal Vo by tuning the center frequency and attenuation level of the tuneable notch filter circuit 108. Elements common to the schematics of FIGS. 4 and 5 share common reference indicia, and only differences between the schematics are described herein for the sake of brevity.

In the illustrated example embodiment of FIG. 5, the adjustment circuit 504 of the tuning circuit 106C generates the center frequency signal TF based on the error signal Verror generated by the phase detector circuit 302. As such, the adjustment circuit 504 can correspond to a feedback regulator control circuit that can adjust the center frequency signal TF until the error signal Verror matches Vbias (e.g., Verror=0 if Vbias is connected to ground). In particular, the adjustment circuit 504 includes the amplifier 312, the resistor Rz, the capacitors Cz, Cc, and the control circuit 406 arranged as shown in FIG. 4. The adjustment circuit 504 can provide to the notch filter circuit 108C the center frequency signal TF based on compensation circuit output VC and the mode signal TM, as described above in connection with FIG. 4. The notch filter circuit 108C includes a variable inductor Lp that can present an inductance based on the center frequency signal TF. Accordingly, the notch filter circuit 108C can receive the center frequency signal TF as an input. The center frequency signal TF can be used to adjust the inductance presented by the inductor Lp to adjust the center frequency of the notch filter circuit 108.

The variable inductor LP can be any suitable circuit and/or device that can present a controllable inductance. The variable inductor LP can correspond to any electrically controlled (digital or analog) variable inductor, such as winding with a variable DC current bias, a MEMS variable inductor, or an inductor array (e.g., a network of inductors and SOI/SOS switches). It will be appreciated by one of ordinary skill in the art that embodiments that utilize a digitally controlled variable inductor can include an analog-to-digital converter (not shown) that receives the analog signal TF and generates a digital signal to tune the variable inductor LP. Example circuits for realizing a digitally controlled variable inductor LP will be described in greater detail later in connection with FIGS. 11 and 12.

FIGS. 6A and 6B are schematic circuit diagrams illustrating example embodiments of notch filter circuits 108D, 108E. The notch filter circuits 108D, 108E adjust their respective Q-factors by switching in a resistance in parallel with an LC tank. Elements common to the schematics of FIGS. 3-6B share common reference indicia, and only differences between the schematics are described herein for the sake of brevity.

With reference to FIG. 6A, a notch filter circuit 108D corresponds to a resonance RLC tank that has an adjustable resistance characteristic for adjusting the attenuation level at the center frequency. In particular, the notch filter circuit 108D comprises three parallel branches coupled between the nodes A and B. The first branch includes an inductor Lp having a first end coupled to node A and a second end coupled to node B. The inductor Lp can provide a fixed inductance or a variable inductance, such as described in connection with FIG. 5. The second branch includes a capacitor Cp having a first end coupled to node A and a second end coupled to node B. The capacitor Cp can provide a fixed capacitance or a variable capacitance, such as described in connection with FIG. 4.

The third branch includes a switch S and a resistor R, forming a switched resistor, connected in series between nodes A and B. The switch S can have a first end coupled to node A and a second end coupled to a first end of the resistor R, which can have a second end coupled to node B. The switch S can receive the attenuation-level signal TA for selectively opening or closing the switch S. The attenuation-level signal TA can be provided by the switch control circuit 318 based on the mode signal TM. Closing the switch S closes the third branch in parallel connection with the first and second branches of the RLC branch and thus decreases the Q-factor the RLC tank. As a result, the attenuation level of the notch filter circuit 108D at the center frequency decreases. Opening the switch S disconnects the resistor R from parallel connection with the first and second branches of the RLC branch and thus increases the Q-factor the RLC tank. As a result, the attenuation level of the notch filter circuit 108D at the center frequency increases. In other words, the notch filter circuit 108D provides less attenuation at the center frequency in response to the switch S being closed in comparison to when the switch S is open.

With reference to FIG. 6B, the notch filter circuit 108E corresponds to another embodiment of the notch filter circuit 108D in which the switch S and the resistor R are replaced by a transistor QR. In particular, the transistor QR can serve a switch having a first terminal coupled to node A and a second terminal coupled to node B. Furthermore, the transistor QR can have a third terminal to receive the attenuation-level signal TA to control the mode of operation of the transistor QR. For example, the transistor QR can correspond to a MOSFET device having a gate that receives the attenuation-level signal TA. The attenuation-level signal TA can selectively operate the transistor QR in a cutoff mode (e.g., the transistor QR is shut off) or a triode mode (also referred to as a linear region or ohmic mode). Operating in the triode mode, the transistor QR is turned on and current is allowed to flow between the drain and the source. The transistor QR operates like a resistor having a resistance controlled by the gate voltage relative to both the source and drain voltages. It will be appreciated by one of ordinary skill that the transistor QR can correspond to any suitable transistor device that can selectively operate as a resistive element or an open switch.

In operation, the switch control circuit 318 generates the attenuation-level signal TA such that the attenuation-level signal TA puts the transistor QR in cutoff in response to the mode signal TM indicating the filtering mode. Thus, the Q-factor of the RLC tank increases and the attenuation level of the notch filter circuit 108D at the center frequency increases. Furthermore, the switch control circuit 318 generates the attenuation-level signal TA such that the attenuation-level signal TA puts the transistor QR in triode mode in response to the mode signal TM indicating the tuning mode. Thus, the Q-factor the RLC tank decreases and the attenuation level of the notch filter circuit 108D at the center frequency decreases.

By switching in a resistance in parallel with an LC tank, the switch S of the notch filter circuits 108D, 108E can be realized with a size that is smaller than that of the switch S used for the series configuration of the capacitor Cp and the switched resistor 316 of FIGS. 3-5. This is because the switch S of FIGS. 3-5 is turned on to substantially remove the effect the resistor R. Accordingly, the switch S of FIGS. 3-5, being placed in series with the capacitance Cp, should have an ON resistance approximately on the order, or less than, the parasitic resistance of the capacitance (e.g., less than about 10 mΩ in some embodiments). To achieve such an ON resistance value, the switch S of FIGS. 3-5 can be a relatively large switch. On the other hand, the switch S of the parallel configuration of FIGS. 6A, 6B places in a resistance when the switch S is turned on. Thus, the switch S of FIGS. 6A, 6B need not have a small ON resistance. For example, the ON resistance of the switch S of FIGS. 6A, 6B can be approximately on the order of the resistance of R or less. In fact, the transistor QR of FIG. 6B provides the resistance of R when the transistor QR is activated by the switch control circuit 318. In an example embodiment, the resistance of the resistor can be chosen to be about e.g., approximately 120Ω. It will be appreciated by one of ordinary skill in the art that other resistances can be chosen to be any suitable value based on, e.g., the load resistance, the inductor Lp, and/or the capacitor Cp.

Figure 7:
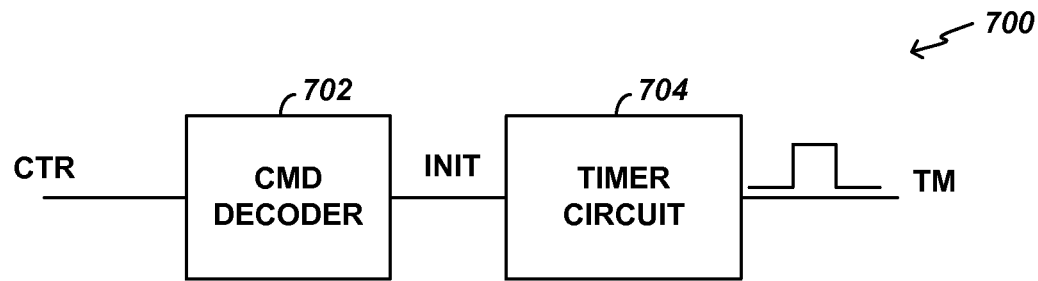
FIG. 7 is a schematic block diagram illustrating an example embodiment of a mode-control circuit.

FIG. 7 is a schematic block diagram illustrating an example embodiment of a mode-control circuit 700. In example embodiments, the mode control circuit 700 can correspond to the mode control circuit 110 of FIGS. 1 and 3-5. The mode control circuit 700 includes a command decoder circuit 702 coupled in series with a timer circuit 704 to receive a control signal CTR as an input and provide the mode signal TM as an output. The command decoder circuit 702 can include circuitry for identifying one or more control operations indicated by the control signal CTR and for asserting the initialization signal INIT based on identifying the one or more control operations. The one or more control operations can correspond to operations associated with initializing a tuning phase for a period of time. For example, the control signal CTR can be indicative of a power-up operation, calibration, recalibration, and/or an initialization operation, which operations include adjusting the center frequency signal TF and or the clock signal TC.

The timer circuit 704 can include circuitry for generating a pulse as the mode signal TM in response to the initialization signal INIT being asserted. In operation, the timer circuit 704 can receive the initialization signal INIT as an input and can generate the mode signal TM as an output. For example, in response to the initialization signal INIT being asserted, the timer circuit 704 can generate the mode signal TM to select or assert the tuning mode for a duration of time. In example embodiments, the duration of time can be for a predetermined period of time selected to allow the tuning circuit 106 of FIG. 1 complete a tuning phase.

Figure 8:
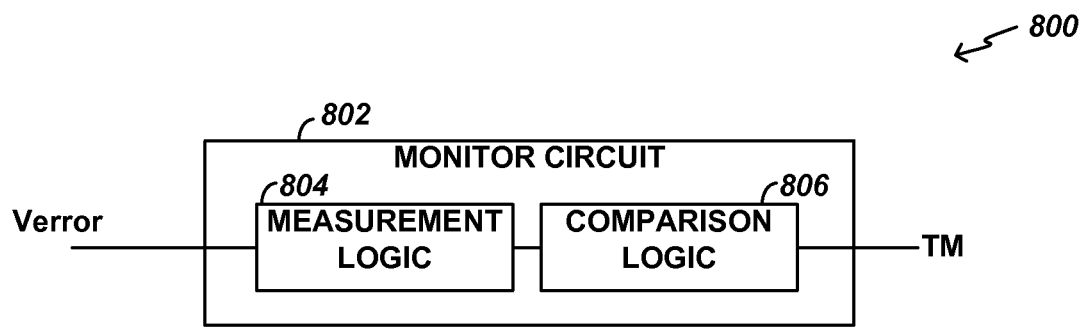
FIG. 8 is a schematic block diagram illustrating another example embodiment of a mode-control circuit.

FIG. 8 is a schematic block diagram illustrating another example embodiment of a mode-control circuit 800. In example embodiments, the mode control circuit 800 can correspond to the mode control circuit 110 of FIGS. 1 and 3-5. In the illustrated example embodiment shown in FIG. 8, the mode control circuit 800 includes the monitor circuit 802 that receives the error signal as an input and generates the mode signal TM as an output. The monitor circuit 802 can determine a level of the phase difference detected by the phase detector, e.g., as determined from the error signal Verror. The monitor circuit 802 can select the filtering mode in response to a determination that the level of the phase difference is below a first predetermined threshold. The monitor circuit 802 can select the tuning mode in response to a determination that the level of the phase difference is above a second predetermined threshold.

Accordingly, the monitor circuit 802 includes a measurement logic circuit 804 and a comparison logic circuit 806. The measurement logic circuit 804 receives the error signal Verror as an input and generates an output that is indicative of a measure of the error signal Verror. The measurement logic circuit 804 can include circuitry for generating a measure of the error signal Verror, such as the magnitude of the error signal or a time integral of the magnitude of the error signal Verror.

The comparison logic circuit 806 receives the output of the measurement logic circuit 804 and provides the mode signal TM as an output. The comparison logic circuit 806 can include circuitry comparing the output of the measurement logic to a threshold and for generating the mode signal TM based on the comparison. For example, in operation, the comparison logic circuit 806 can assert the tuning mode when the measure of the error signal Verror generated by the measurement logic circuit 804 exceeds the threshold. Additionally or alternatively, the comparison logic circuit 806 can assert the filtering mode when the measure of the error signal Verror generated by the measurement logic circuit 804 is less than the threshold.

In this way, the mode control circuit 800 can facilitate automatic switching between the filtering mode and the tuning mode in real time based on performance of the system. Moreover, automatically switching from the tuning mode to the filtering mode can prevent "tuning drift" over time, which can deteriorate filtering performance. Moreover, automatically switching from the tuning mode to the filtering mode can facilitate automatic detection of when tuning has reached sufficient accuracy as determined by the threshold and thereby reduce the period of time of the tuning mode. Furthermore, automatically switching from the filtering mode to the tuning mode can facilitate improved filtering over time when it is determined that the center frequency of the notch filter circuit 108 no longer substantially matches the center frequency of the target noise components.

It will be appreciated by one of ordinary skill in the art that a first threshold to determine the switching from the tuning mode to the filtering mode can be used, and that a second threshold to determine the switching from the filtering mode to the tuning mode can be used. The first threshold and the second threshold can be substantially the same or, alternatively, substantially different. For example, the first threshold can be less than the second threshold.

Figure 9:
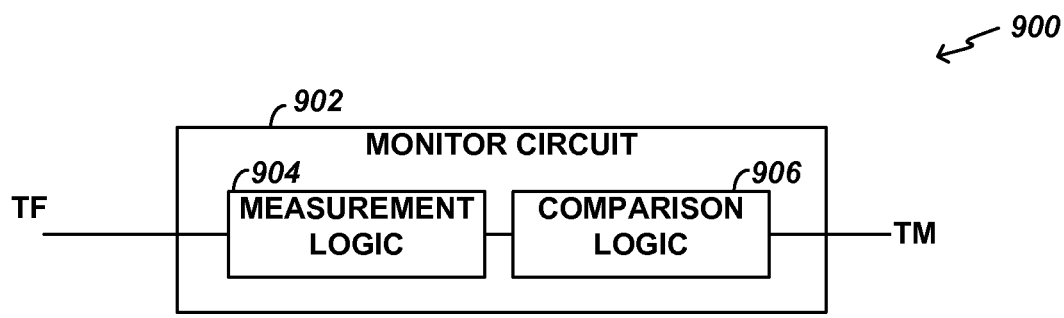
FIG. 9 is a schematic block diagram illustrating another example embodiment of a mode-control circuit.

FIG. 9 is a schematic block diagram illustrating another example embodiment of a mode-control circuit 900. In example embodiments, the mode control circuit 900 can correspond to the mode control circuit 110 of FIGS. 1 and 3-5. In the illustrated example embodiment shown in FIG. 9, the mode control circuit 900 includes a monitor circuit 902 that receives the center frequency signal TF as an input and generates the mode signal TM as an output. In operation, the monitor circuit 902 can determine a level of change of the center frequency signal TF. The monitor circuit 902 can select the filtering mode in response to a determination that the level of change is below a first predetermined threshold. Additionally or alternatively, the monitor circuit 902 can select the tuning mode in response to a determination that the level of change is above a second predetermined threshold.

Accordingly, the monitor circuit includes a measurement logic circuit 904 and a comparison logic circuit 906. The measurement logic circuit 904 receives the center frequency signal TF as an input and generates an output that is indicative of a measure of the error signal Verror. The measurement logic circuit 904 can include circuitry for generating a measure of the error signal Verror, such as a magnitude of a difference signal of the center frequency signal TF (e.g., TF(t2)−TF(t1)) or a derivative signal of the center frequency signal TF. The derivative signal can correspond to the magnitude of an approximate derivative of the center frequency signal TF. For example, the measurement logic circuit 904 can include circuitry implementing a "dirty" or approximate derivative filter (e.g., a band-limited derivative filter).

The comparison logic circuit 906 receives the output of the measurement logic circuit 904 and provides the mode signal TM as an output. The comparison logic circuit 906 can include circuitry for comparing the output of the measurement logic circuit 904 to a threshold and for generating the mode signal TM based on the comparison. For example, in operation, the comparison logic circuit 906 can assert the mode signal TM from the tuning mode to the filtering mode response to the measure of the center frequency signal TM becoming less than a threshold.

In this way, the mode control circuit 900 can facilitate automatic switching from the tuning mode to the filtering mode in real time. Moreover, automatically switching from the tuning mode to the filtering mode can facilitate preventing "tuning drift" over time, which can deteriorate filtering performance. Moreover, automatically switching from the tuning mode to the filtering mode can facilitate automatic detection of when tuning has reached sufficient accuracy as determined by the threshold, and thereby reduce the time spent in the tuning mode.

Figure 10:
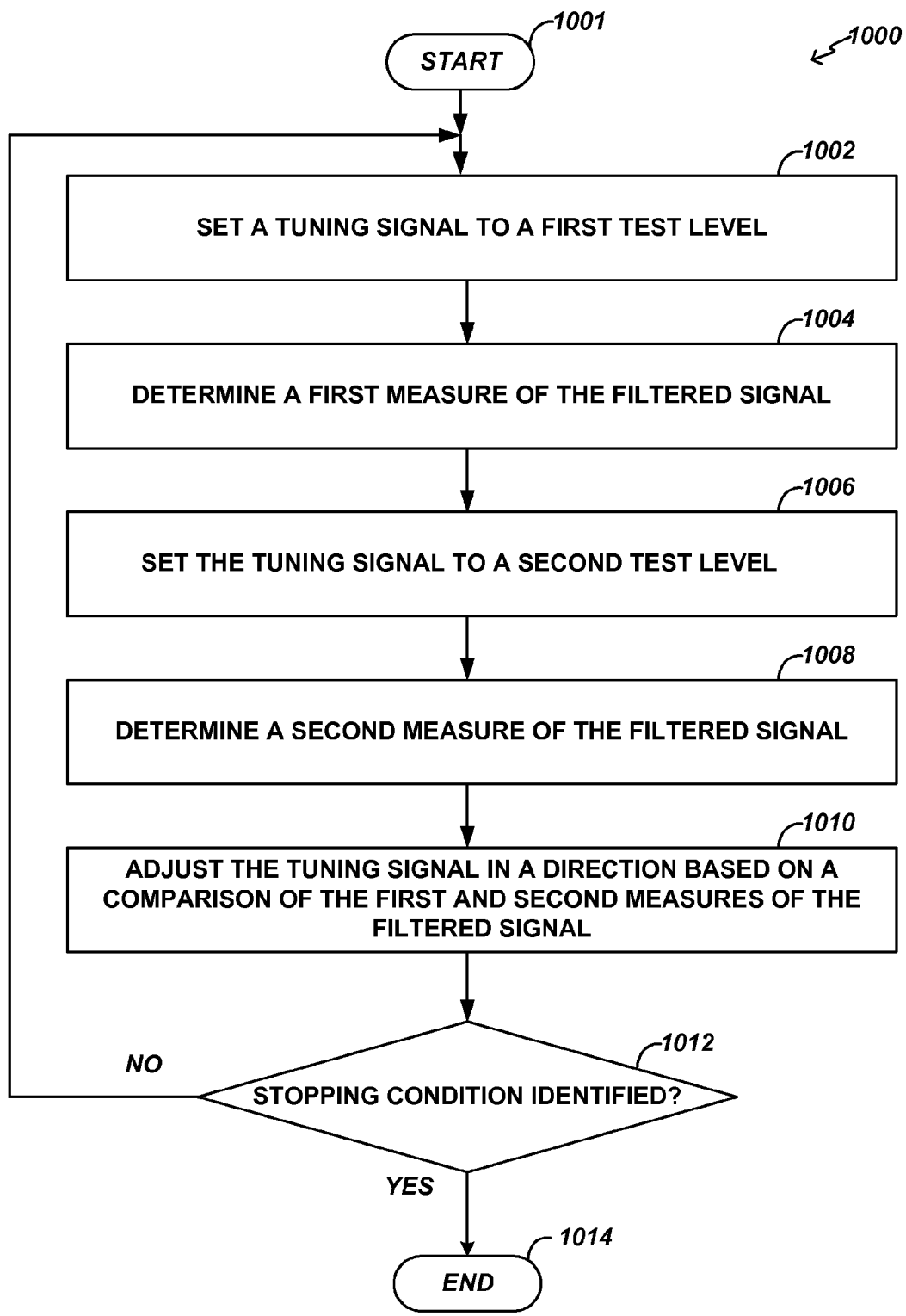
FIG. 10 is a flowchart illustrating an example method of adjusting a tuneable notch filter, in accordance with an example embodiment.

FIG. 10 is a flowchart illustrating an example method 1000 of adjusting a tuneable notch filter, in accordance with an example embodiment. The method 1000 can correspond to a perturb-and-observe method in which the tuning signal TF is adjusted in test directions and the response is observed to determine which direction to adjust the tuning signal TF. The method 1000 may be implemented by the tuning circuit 106 of FIG. 1 to generate a tuning signal TF for adjusting the center frequency of the stopband region of the notch filter circuit 108. In an example embodiment, the method 1000 can be implemented by one or more processors, executing non-transitory machine-readable instructions, included by the tuning circuit 106. The method 1000 can be used in addition to or as an alternative to the circuits described in connection with FIGS. 3-5. The method 1000 will be described below, by way of explanation, as being performed by certain components of the electronic system 100. It will be appreciated, however, that the operations of the method 1000 can be performed in any suitable order by any number of the components shown in FIG. 1.

The method 1000 starts at block 1001 and proceeds to block 1002 for setting a tuning signal TS to a first test level TL1. The tuning signal TS can correspond to the clock signal TC, the center frequency signal TF, or both. The first test level TL1 may be a predetermined initial value or may be based on a previous value. At block 1004, the method 1000 includes determining a first measure M1 of the filtered signal in response to applying the tuning signal TS at the first test level TL1. For example, the first measure M1 can correspond to a measure of the error signal Verror, which is indicative of the phase difference between the input and output of the notch filter circuit 108, as described above in connection with FIG. 3.

At block 1006, the method 1000 includes setting the tuning signal TS to a second test level TL2. The second test level TL2 can correspond to a predetermined increment added to the first test level TL1. At block 1008, the method 1000 includes determining a second measure M2 of the filtered signal in response to applying the tuning signal TS at the second test level TL2. For example, the second measure M2 can correspond to a similar measurement that was used to determine the first measure M1.

At block 1010, the method 1000 includes adjusting the tuning signal TS in a direction based on a comparison of the first and second measures of the filtered signal. For example, in response to determining that the difference M2−M1 is negative (e.g., indicating the error signal has decreased), the tuning circuit 106 can adjust the tuning signal TS in a direction similar to the increment performed at the block 1006. In response to determining that the difference M2−M1 is positive (e.g., indicating the error signal Verror has increased), the tuning circuit 106 can adjust the tuning signal TS in a direction opposite to the increment performed at the block 1006.

For example, the tuning signal TS can be set to a value corresponding to the first test level TL1 plus an increment $\Delta$: TS=TL1+$\Delta$. In an example embodiment, the increment $\Delta$ can have a fixed magnitude and can have a sign that is based on the difference M2−M1. In particular, the increment $\Delta$ can be a positive value in response to the difference M2−M1 being negative, and the increment $\Delta$ can be a negative value in response to the difference M2−M1 being positive.

In another example embodiment, the increment $\Delta$ can have a magnitude and a sign that is based on the difference M2−M1. In particular, the increment $\Delta$ can be proportional to M1−M2: $\Delta \approx \lambda$ (M1−M2), where $\lambda$ is a positive non-zero value. Setting the increment to be proportional to M1−M2 can reduce oscillations in the tuning signal TS and can improve the precision of tuning.

At block 1012, the method 1000 includes determining whether a stopping condition has been identified. For example, the tuning circuit 106 can compare the difference M2−M1 to a threshold value. In response to a determination that the difference M2−M1 exceeds a threshold value, the method 1000 may return to block 1002 and repeat the operations of the blocks 1002-1010. In particular, the first test level TL1 of a new iteration of the blocks 1002-1010 may correspond to the tuning signal TS determined at block 1010. It will be appreciated by one of ordinary skill in the art that the determination of the first measure M1 at block 1004 can be omitted if the first measure M1 was previously determined, e.g., during a previous iteration of the blocks 1002 through 1010. In response to a determination that the difference M2−M1 is less than a threshold value, the method 1000 may proceed to the block 1014 and end.

Figure 11:
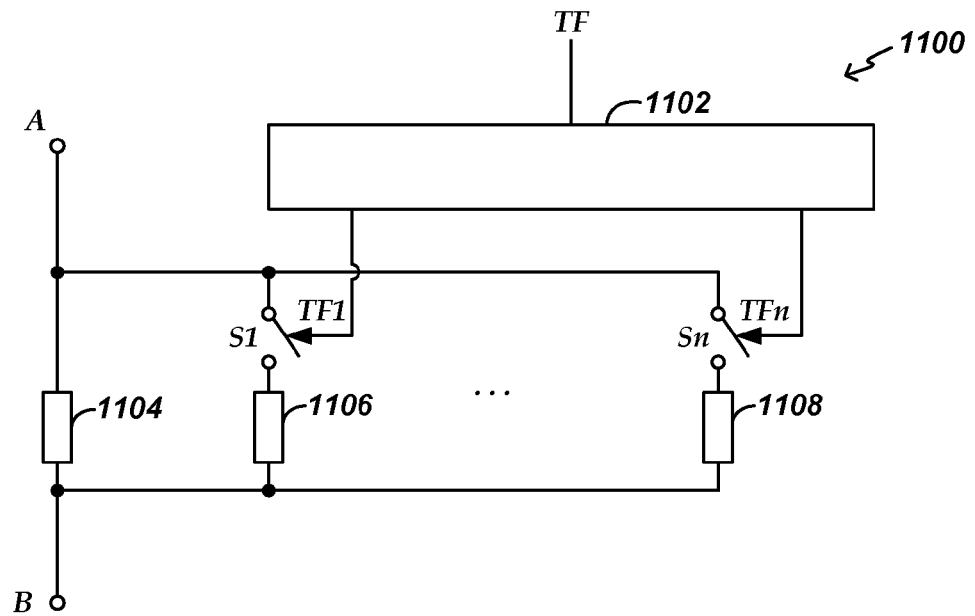
FIG. 11 is schematic circuit diagram illustrating an example embodiment of a tunable circuit element for the notch filter circuits of FIGS. 4 and 5.

FIG. 11 is schematic circuit diagram illustrating an example embodiment of a tunable circuit element 1100 for the notch filter circuits 108B, 108C of FIGS. 4 and 5. The tunable circuit element 1100 can correspond to a variable capacitor Cp of FIG. 4 or the variable inductor Lp of FIG. 5. The tunable circuit element 1100 includes an ADC 1102, one or more reactance elements 1104, 1106, 1108, and one or more switches S1, Sn. The ADC 1102 can include mixed signal circuitry for converting the analog signal TF to a digital thermocode represented by the n digital signals TF1, . . . , TFn.

The reactance elements 1104, 1106, 1108 are arranged in parallel between the nodes A and B. In an example embodiment for providing the variable capacitor Cp of FIG. 4, the reactance elements 1104, 1106, 1108 correspond to fixed capacitors. In an example embodiment for providing the variable inductor Lp of FIG. 4, the reactance elements 1104, 1106, 1108 correspond to fixed inductors. The switches S1, . . . , Sn are arranged in series with respective reactance elements 1106, 1108 to selectively open and selectively close the corresponding branches based on the respective signals TF1, . . . , TFn.

In operation, the ADC 1102 receives the analog center-frequency signal TF and generates the digital signals TF1, . . . , TFn to switch in a number of the reactance elements 1106, . . . , 1108 based on the frequency signal TF. The number of reactance elements 1106, . . . , 1108 that are switched on can be based on the magnitude of the center-frequency signal TF. Varying the number of reactance elements switched in can be used to vary the reactance (e.g., capacitance or inductance) presented between the nodes A and B. The reactance element 1104 can serve to provide a fixed baseline reactance.

Figure 12:
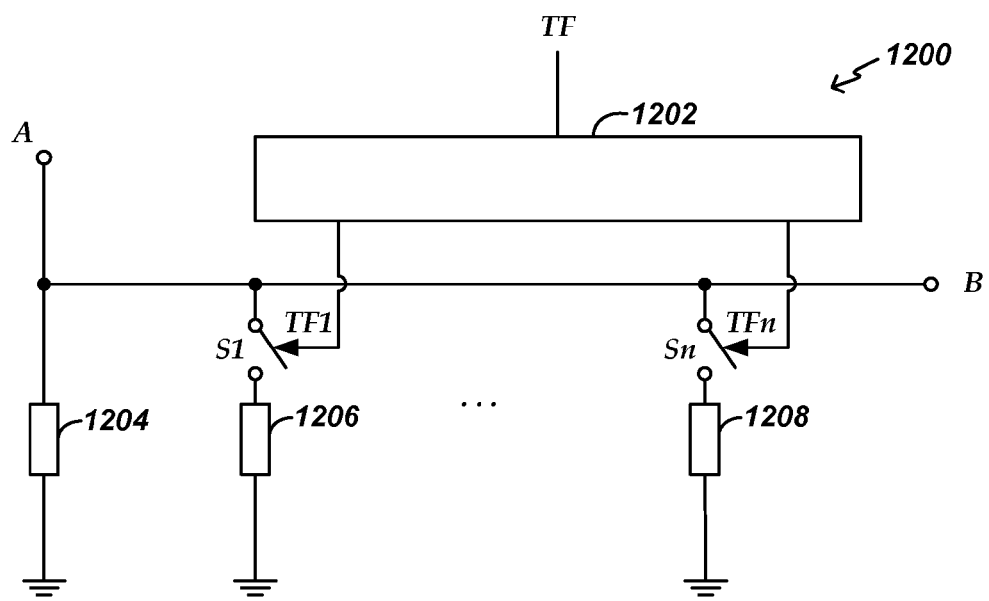
FIG. 12 is schematic circuit diagram illustrating another example embodiment of a tunable circuit element for the notch filter circuits of FIGS. 4 and 5.

FIG. 12 is schematic circuit diagram illustrating another example embodiment of a tunable circuit element 1200 for the notch filter circuits 108B, 108C of FIGS. 4 and 5. The tunable circuit element 1200 can correspond to a variable capacitor Cp of FIG. 4 or the variable inductor Lp of FIG. 5. The tunable circuit element 1200 includes an ADC 1202, one or more reactance elements 1204, 1206, 1208, and one or more switches S1, Sn. The ADC 1202 can include mixed signal circuitry for converting the analog center-frequency signal TF to a digital thermocode represented by the n signals TF1, . . . , TFn.

The reactance elements 1204, 1206, 1208 are arranged in a shunt configuration in which the reactance elements 1204, 1206, 1208 are connected in parallel between the node A and ground, and nodes A and B correspond to a common node of the tunable circuit element 1200. In an example embodiment for providing the variable capacitor Cp of FIG. 4, the reactance elements 1204, 1206, 1208 correspond to fixed capacitors. In an example embodiment for providing the variable inductor Lp of FIG. 4, the reactance elements 1204, 1206, 1208 correspond to fixed inductors. The switches S1, . . . , Sn are arranged in series with respective reactance elements 1206, 1208 to selectively open and selectively close the corresponding branches based on the signals TF1, . . . , TFn.

In operation, the ADC 1202 receives the frequency signal TF and generates the signals TF1, . . . , TFn to switch in a number of the reactance elements 1206, . . . , 1208 based on the frequency signal TF. The number of reactance elements 1206, . . . , 1208 that are switched on can be based on the magnitude of the center-frequency signal TF. Varying the number of reactance elements switched in can be used to vary the reactance (e.g., capacitance or inductance) presented between the nodes A and B. The reactance element 1204 can serve to provide a fixed baseline reactance.

The NMOS and PMOS transistors described herein can correspond to insulated gate field-effect transistors, such as MOSFETs. However, it will be understood that a gate can be made from materials other than metals, such as polysilicon, and an insulation layer can be made out of materials other than silicon oxide, such as a high k dielectric. It will also be understood that the FETs can have various structural types other than MOSFETs, including, but not limited to, BJT, JFET, IGFET, MESFET, pHEMT, HBT, and the like transistor structural types. Further, FETs can also have various polarities, such as N-channel, P-channel, NPN-type, and PNP-type; and can include various semiconductor materials, such as Si, SiC, GaAs, GaN, SiGe, and the like.

Some of the embodiments disclosed herein have been described with specific signals implemented as current-mode or voltage-mode signals, but the inventive principles also contemplate other types of signals, whether characterized as voltages or currents.

APPLICATIONS

Devices employing the above-described schemes can be implemented into various electronic devices. Examples of the electronic devices can include, but are not limited to, consumer electronic products, parts of the consumer electronic products, electronic test equipment, and the like. Examples of the electronic devices can also include memory chips, memory modules, circuits of optical networks or other communication networks, and disk driver circuits. The consumer electronic products can include, but are not limited to, a power converter, mobile phone, base stations, communication modems, a telephone, a television, a computer monitor, a computer, a hand-held computer, a personal digital assistant (PDA), a microwave, a refrigerator, an automobile, a stereo system, a cassette recorder or player, a DVD player, a CD player, a VCR, an MP3 player, a radio, a camcorder, a camera, a digital camera, a portable memory chip, a washer, a dryer, a washer/dryer, a copier, a facsimile machine, a scanner, a multi-functional peripheral device, a wrist watch, a clock, and the like. Further, the electronic device can include unfinished products.

Although this inventive subject matter has been described in terms of certain embodiments, other embodiments that are apparent to those of ordinary skill in the art, including embodiments that do not provide all of the features and benefits set forth herein, are also within the scope of this inventive subject matter. Moreover, the various embodiments described above can be combined to provide further embodiments. In addition, certain features shown in the context of one embodiment can be incorporated into other embodiments as well. Accordingly, the scope of the present inventive subject matter is defined only by reference to the appended claims.

Moreover, the foregoing description and claims may refer to elements or features as being "connected" or "coupled" together. As used herein, unless expressly stated otherwise, "connected" means that one element/feature is directly or indirectly connected to another element/feature, and not necessarily mechanically. Likewise, unless expressly stated otherwise, "coupled" means that one element/feature is directly or indirectly coupled to another element/feature, and not necessarily mechanically. Thus, although the various schematics shown in the figures depict example arrangements of elements and components, additional intervening elements, devices, features, or components may be present in an actual embodiment, assuming that the functionality of the depicted circuits is not adversely affected.

What is claimed is:

1. A circuit comprising:
   a switching regulator circuitry to generate a power supply signal based on a first tuning signal corresponding to a clock signal, the power supply signal including a signal component at a first frequency based on the first tuning signal;
   a notch filter circuit to filter the power supply signal, the notch filter circuit having an input-output frequency response that includes a stopband region having a center frequency and an attenuation level, the attenuation level of the stopband region being based at least in part on a second tuning signal; and
   a tuning circuit operable in at least two modes to generate the first and second tuning signals, the at least two modes including a tuning mode and a filtering mode, the tuning circuit being operable in the at least two modes to generate the second tuning signal such that the attenuation level of the stopband region is greater in the filtering mode than in the tuning mode, the tuning circuit being operable in the tuning mode to generate the first tuning signal such that the tuning circuit adjusts the first tuning signal based at least on the unfiltered power supply signal and the filtered power supply signal to match the center frequency of the stopband region with the frequency of the signal component of the power supply signal.

2. The circuit of claim 1, wherein the tuning circuit is operable in the filtering mode to generate the first tuning signal at a substantially constant value.

3. The circuit of claim 1, wherein the notch filter comprises:
   a first node to receive the power supply signal;
   a second node to provide the filtered power supply signal;
   a switched resistor to provide a resistance based on the second tuning signal, wherein the attenuation level of the stopband region is based at least on the resistance provided by the switched resistor;
   a capacitor connected with the switched resistor between the first and second nodes to form a series connection; and
   an inductor connected to the first and second nodes in parallel with the series connection of the switched resistor and the capacitor.

4. The circuit of claim 1, further comprising a mode-control circuit to select a selected one of the at least two modes of the tuning circuit.

5. The circuit of claim 4, wherein the mode-control circuit comprises:
   an input node to receive an indication indicative of a request to initialize the notch filter; and
   a timer circuitry to select the tuning mode in response to receiving the indication and to select the filtering mode after a predetermined duration of the selecting of the tuning model.

6. The circuit of claim 4, wherein:
   the tuning circuit comprises:
      a phase detector circuit to detect a phase difference between the power supply signal generated by the switching regulator circuitry and the filtered power supply signal; and
      an adjustment circuit to generate the second tuning signal based on the detected phase difference; and
   the mode-control circuit comprises:
      a monitor circuit to determine a level of the phase difference detected by the phase detector, wherein the monitor circuit is to select the filtering mode in response to a determination that the level of the phase difference is below a first predetermined threshold, wherein the monitor circuit is to select the tuning mode in response to a determination that the level of the phase difference is above a second predetermined threshold.

7. The circuit of claim 6, wherein the adjustment circuit corresponds to a feedback control circuit to generate the second tuning signal based on the detected phase difference by adjusting the second tuning signal to adjust the detected phase difference to about 90 degrees.

8. A tunable filter circuit comprising:
   a notch filter circuit to receive an input signal and first and second tuning signals and to provide an output signal, the notch filter circuit having an input-output frequency response that includes a stopband region, the stopband region having a center frequency based at least on the first tuning signal and having an attenuation level based at least on the second tuning signal; and
   a tuning circuit operable in at least two modes to generate the first and second tuning signals, the at least two modes including a tuning mode and a filtering mode, wherein the tuning circuit, in response to operating in the tuning mode, adjusts the first tuning signal based on the input signal and the output signal, wherein the tuning circuit is to generate the second tuning signal such that the attenuation level of the stopband region is greater in the filtering mode than in the tuning mode.

9. The circuit of claim 8, wherein the tuning circuit generates the first tuning signal at a substantially constant value in response to operating in the filtering mode.

10. The circuit of claim 8, wherein the notch filter comprises:
a first node to receive a power supply signal;
a second node to provide the filtered power supply signal;
a switched resistor to provide a resistance based on the second tuning signal, wherein the attenuation level of the stopband region is based at least on the resistance provided by the switched resistor;
a capacitor connected with the switched resistor between the first and second nodes to form a series connection; and
an inductor connected to the first and second nodes in parallel with the series connection of the switched resistor and the capacitor, wherein the capacitor and the inductor provide an adjustable reactance based at least on the first tuning signal, the center frequency of the stopband region is based at least on the adjustable reactance.

11. The circuit of claim 10, wherein the capacitor corresponds to a variable capacitor to present an amount of capacitance based at least on the first tuning signal.

12. The circuit of claim 8, further comprising a mode-control circuit to select a selected one of the at least two modes of the tuning circuit, the mode-control circuit comprising:
an input node to receive an indication indicative of a request to initialize the notch filter; and
a timer circuitry to select the tuning mode in response to receiving the indication and to select the filtering mode after a predetermined duration of the selecting of the tuning model.

13. The circuit of claim 8, wherein the tuning circuit comprises:
a phase detector circuit to detect a phase difference between the input signal and the output signal of the notch filter circuit; and
an adjustment circuit to generate the first tuning signal based on the detected phase difference.

14. The circuit of claim 13, further comprising a mode-control circuit to select a selected one of the at least two modes of the tuning circuit, the mode-control circuit comprising:
a monitor circuit to determine a level of the phase difference detected by the phase detector, wherein the monitor circuit is to select the filtering mode in response to a determination that the level of the phase difference is below a first predetermined threshold, wherein the monitor circuit is to select the tuning mode in response to a determination that the level of the phase difference is above a second predetermined threshold.

15. The circuit of claim 13, wherein the tuning circuit is to generate the first tuning signal based on:
setting the first tuning signal to a first test level;
determining a first measure of the output signal;
setting the first tuning signal to a second test level;
determining a second measure of the output signal; and
adjusting the first tuning signal in a direction based on a comparison of the first and second measures of the output signal.

16. A method to filter a signal, the method comprising:
receiving first and second tuning signals at tuning nodes of a notch filter, the notch filter having an input node and an output node providing an input-output frequency response that includes a stopband region, the stopband region having a center frequency based on the first tuning signal and having an attenuation level based on the second tuning signal;
filtering an input signal at the input node of the notch filter to generate a filtered signal at the output node of the notch filter; and
generating the first and second tuning signals in one of at least two modes, the at least two modes including a tuning mode and a filtering mode, the generating of the first and second tuning signals comprising:
in response to switching from the filtering mode to the tuning mode:
generating the second tuning signal to decrease the attenuation level of the stopband region; and
adjusting the first tuning signal based on the input signal and the filtered signal; and
in response to switching from the tuning mode to the filtering mode, generating the second tuning signal to increase the attenuation level of the stopband region.

17. The method of claim 16, wherein the generating of the first and second tuning signals includes, in response to being in the filtering mode, setting the first tuning signal at a substantially constant value.

18. The method of claim 16, wherein the filtering of the input signal uses the notch filter that comprises a first and second node, a switched resistor to provide a resistance based on the second tuning signal, a capacitor connected with the switched resistor between the first and second nodes to form a series connection, and an inductor connected to the first and second nodes in parallel with the series connection of the switched resistor and the capacitor.

19. The method of claim 16, wherein the adjusting of the first tuning signal comprises:
detecting a phase difference between the input signal and the filtered signal; and
generating the first tuning signal based on the detected phase difference.

20. The method of claim 19, further comprising selecting a selected one of the at least two modes, the selecting of the selected one comprising:
determining a level of the phase difference;
selecting the filtering mode in response to a determination that the level of the phase difference is below a first threshold; and
selecting the tuning mode in response to a determination that the level of the phase difference is above a second predetermined threshold.

* * * * *